United States Patent
Choi et al.

(10) Patent No.: US 11,924,988 B2
(45) Date of Patent: Mar. 5, 2024

(54) DISPLAY APPARATUS

(71) Applicant: Samsung Electronics Co., Ltd., Suwon-si (KR)

(72) Inventors: Hyun Yong Choi, Suwon-si (KR); Young Chul Kim, Suwon-si (KR); Ji Su Kim, Suwon-si (KR); Hun Sung Kim, Suwon-si (KR); Sung Yong Park, Suwon-si (KR); Jin Soo Shin, Suwon-si (KR); Dae Sik Yoon, Suwon-si (KR); Yong Yeon Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/088,288

(22) Filed: Dec. 23, 2022

(65) Prior Publication Data
US 2023/0125914 A1   Apr. 27, 2023

Related U.S. Application Data

(63) Continuation of application No. 16/586,110, filed on Sep. 27, 2019, now Pat. No. 11,582,877.

(30) Foreign Application Priority Data

Apr. 25, 2019  (KR) ......................... 10-2019-0048675
Sep. 5, 2019  (KR) ......................... 10-2019-0110360

(51) Int. Cl.
*H05K 5/02* (2006.01)
*F16H 1/20* (2006.01)
(Continued)

(52) U.S. Cl.
CPC ........... *H05K 5/0234* (2013.01); *F16H 1/203* (2013.01); *F16H 37/00* (2013.01); *F16M 11/105* (2013.01);
(Continued)

(58) Field of Classification Search
CPC ....... H05K 5/0234; F16H 1/203; F16H 37/00; F16M 11/105; F16M 11/18; F16M 11/22;
(Continued)

(56) References Cited

U.S. PATENT DOCUMENTS 5,355,600 A * 10/1994 Thompson .............. G09F 19/12
                                                    40/435
5,520,065 A    5/1996 Hansen
(Continued)

FOREIGN PATENT DOCUMENTS

CN   1754134 A    3/2006
CN   101109436   1/2008
(Continued)

OTHER PUBLICATIONS

Extended European Search Report dated Apr. 17, 2020 from European Application No. 19200311.9, 7 pages.
(Continued)

*Primary Examiner* — Muhammad Ijaz
(74) *Attorney, Agent, or Firm* — STAAS & HALSEY LLP

(57) ABSTRACT

A display apparatus including a display and a supporter. The supporter being mounted on the display and configured to support the display and rotate the display module between a first position and a second position. The supporter including a drive motor, a first gear, and a detection sensor. The drive motor configured to supply a driving force to rotate the display. The first gear configured to rotate together with the display by receiving the driving force from the drive motor. The detection sensor configured to detect a rotation amount of a second gear configured to rotate in with the first gear.

12 Claims, 26 Drawing Sheets

(51) Int. Cl.
*F16H 37/00* (2006.01)
*F16M 11/10* (2006.01)
*F16M 11/18* (2006.01)
*F16M 11/22* (2006.01)
*H02K 7/116* (2006.01)
*H02K 11/22* (2016.01)

(52) U.S. Cl.
CPC ............. *F16M 11/18* (2013.01); *F16M 11/22* (2013.01); *H02K 7/1166* (2013.01); *H02K 11/22* (2016.01)

(58) Field of Classification Search
CPC ...... F16M 11/06; H02K 7/1166; H02K 11/22; F16F 15/08; G09F 9/00
USPC ........ 345/204; 248/917, 918, 920, 921, 922, 248/923
See application file for complete search history.

(56) References Cited

U.S. PATENT DOCUMENTS

| | | | | |
|---|---|---|---|---|
| 6,125,028 | A * | 9/2000 | Matsumoto | G07F 17/26 248/920 |
| 6,249,278 | B1 * | 6/2001 | Segan | G09F 19/02 345/204 |
| 6,889,578 | B2 * | 5/2005 | Spaziani | F16H 37/065 74/661 |
| 7,239,101 | B2 * | 7/2007 | Choi | B60R 11/0235 318/16 |
| 2002/0001049 | A1 * | 1/2002 | Endo | B60K 35/00 349/58 |
| 2008/0303805 | A1 * | 12/2008 | Chien | F16M 11/18 345/204 |
| 2016/0176547 | A1 * | 6/2016 | Kalman | F16M 11/105 464/157 |
| 2017/0254469 | A1 | 9/2017 | Okamura et al. | |
| 2020/0053891 | A1 * | 2/2020 | Kim | F16M 11/18 |
| 2022/0117103 | A1 * | 4/2022 | Kang | F16M 11/105 |

FOREIGN PATENT DOCUMENTS

| | | |
|---|---|---|
| CN | 102400907 | 4/2012 |
| CN | 107076268 | 8/2017 |
| CN | 109144178 A | 1/2019 |
| DE | 10 2005 006 341 A1 | 8/2006 |
| GB | 2 245 644 A | 1/1992 |
| JP | 2009-15139 A | 1/2009 |
| KR | 1998-036044 | 9/1998 |
| KR | 10-2005-0088725 | 9/2005 |
| KR | 20-0434185 Y | 12/2006 |
| KR | 10-0710814 B1 | 4/2007 |
| KR | 10-0975575 B1 | 8/2010 |
| KR | 10-2011-0038559 A | 4/2011 |
| KR | 10-2014-0122597 A | 10/2014 |
| KR | 10-2016-0032382 | 3/2016 |
| WO | 2005/019720 A1 | 3/2005 |

OTHER PUBLICATIONS

International Search Report dated Jan. 23, 2020 from International Application No. PCT/KR2019/012759, 3 pages.
Chinese Office Action dated Jun. 30, 2021 from Chinese Application No. 201910864133.6.
Chinese Office Action dated Nov. 22, 2021 from Chinese Application No. 201910864133.6.
Extended European Search Report dated Apr. 4, 2022 from European Application No. 21208884.3.
Indian Office Action dated May 5, 2022 from Indian Application No. 202117054118.
U.S. Office Action dated Apr. 28, 2022 in U.S. Appl. No. 16/586,110.
U.S. Office Action dated Oct. 18, 2022 in U.S. Appl. No. 16/586,110.
U.S. Appl. No. 16/586,110, filed Sep. 27, 2019, Hyun Yong Choi, Samsung Electronics Co., Ltd.
Office Action dated Oct. 29, 2023 in Chinese Patent Application No. 202210053840.9.

* cited by examiner

DISPLAY APPARATUS

CROSS-REFERENCE TO RELATED APPLICATIONS

This application is a continuation application of U.S. patent application Ser. No. 16/586,110 filed on Sep. 27, 2019, which claims the priority benefit under 35 U.S.C. § 119 to Korean Patent Application No. 10-2019-0048675, filed on Apr. 25, 2019 and 10-2019-0110360, filed on Sep. 5, 2019 in the Korean Intellectual Property Office, the disclosures of which are incorporated by reference herein in their entirety.

BACKGROUND

1. Field

The disclosure relates to a display apparatus, and more particularly to a display apparatus including a display module and a supporter capable of rotating and supporting the display module.

2. Description of the Related Art

A display apparatus is a type of output device that visually displays data information such as characters and graphics, and images.

The display apparatus may include a self- emission type display panel such as an organic light emitting diode (OLED) panel, or a non-self-emission type display panel such as a liquid crystal display (LCD) panel.

The display apparatus may include a display module for displaying an image and a supporter for supporting the display module. The supporter may be provided to support the display module so that the front surface of the display module displaying the image may face the viewer.

Aspect ratios of an image displayed on the display module may vary. The aspect ratio of an image may be provided such that a horizontal length (width) and a vertical length (height) are the same (i.e., 1:1), a horizontal length is greater than a vertical length, and a horizontal length is less than a vertical length. The aspect ratio is rarely provided in 1:1 ratio, and it is common to provide a horizontal image in which a horizontal length is greater than a vertical length, or a vertical image in which a vertical length is greater than a horizontal length. Accordingly, generally, the display module may be provided such that a horizontal length is different from a vertical length.

When the vertical image is displayed on the display module having the horizontal length greater than the vertical length, it is difficult to efficiently use a screen display area of the display module and vice versa.

Therefore, it is required to arrange the display module horizontally or vertically according to the aspect ratio of the image.

SUMMARY

Therefore, it is an aspect of the disclosure to provide a display apparatus including a display module and a supporter capable of rotating and supporting the display module.

It is another aspect of the disclosure to provide a display apparatus capable of arranging a display module horizontally or vertically.

It is another aspect of the disclosure to provide a display apparatus capable of reducing vibration and noise generated when a display module rotates.

It is another aspect of the disclosure to provide a display apparatus having improved space utilization and aesthetics by reducing a thickness of a display module and a supporter.

Additional aspects of the disclosure will be set forth in part in the description which follows and, in part, will be obvious from the description, or may be learned by practice of the disclosure.

In accordance with an aspect of the disclosure, a display apparatus includes a display module, and a supporter on which the display module is mounted, and configured to support the display module and configured to rotate the display module between a first position and a second position, and the supporter includes a drive motor configured to supply a driving force to rotate the display module, a first gear configured to rotate together with the display module by receiving the driving force from the drive motor, and a detection sensor configured to detect an rotation amount of a second gear configured to rotate in association with the first gear.

The first gear may include a first gear portion formed in one section of the circumferential surface of the first gear and a second gear portion formed in a remaining section of the circumferential surface of the first gear and configured to have a tooth shape different from that of the first gear portion.

The display apparatus may further include a third gear connected to a drive shaft to rotate together with the drive shaft of the drive motor.

The second gear may rotate in engagement with the first gear portion.

The third gear may rotate in engagement with the second gear portion.

A rotation axis of the first gear and a rotation axis of the second gear may be arranged in parallel with each other.

The rotation axis of the first gear and a rotation axis of the third gear may cross each other.

The first gear portion may include a spur gear.

The second gear portion may include a helical gear.

The second gear may include a spur gear.

The third gear may include a worm gear.

The supporter may further include a gear shaft configured to rotate together with the third gear, and a shaft connecting member configured to connect the gear shaft to the drive shaft to allow the drive shaft and the gear shaft to rotate together.

The shaft connecting member may include a cylindrical body in which the gear shaft and the drive shaft are coupled to opposite ends thereof, respectively, and a bending groove formed to be recessed along a circumferential of the body, The bending groove may be provided in plural in an axial direction of the gear shaft or the drive shaft.

The supporter may further include a disk configured to rotate together with the second gear, and the disk may include a plurality of slits arranged at a predetermined interval on an edge of the disk.

The detection sensor may include an optical transmitter arranged on one side of the disk, and an optical receiver arranged on the other side of the disk.

The first gear may include a push protrusion configured to protrude radially outward of the first gear.

The supporter may further include a switch pushed by the push protrusion when the display module is located at the first position or the second position.

When the switch is pushed by the push protrusion, the drive motor may stop the supply of the driving force.

The display apparatus may further include a roller installed on a rear surface of the display module or a front surface of the supporter facing the rear surface of the display module, The roller may be configured to maintain a distance in a front-rear direction between the display module and the supporter by being in contact with the rear surface of the display module or the front surface of the supporter.

The display apparatus may further include a flexible printed circuit board configured to electrically connect the display module to the supporter.

The flexible printed circuit board may be installed such that a first end thereof is electrically connected to the display module and a second end thereof is electrically connected to the supporter.

The flexible printed circuit board may include a connector provided between the first end and the second end.

The connector may be cut into several branches along a direction in which the flexible printed circuit board extends.

The flexible printed circuit board may electrically connect the display module to the supporter by passing through a first opening provided at the rear surface of the display module and a second opening provided at the front surface of the supporter and corresponding to the first opening.

In accordance with an aspect of the disclosure, a display apparatus includes a display module, and a supporter configured to support the display module and configured to rotate the display module within a predetermined range in a first direction or a second direction, and the supporter includes a gear coupled to the display module to rotate together with the display module, and including a first gear portion formed in one section of the circumferential surface of the gear, and a second gear portion formed in a remaining section of the circumferential surface of the gear and configured to have a tooth shape different from that of the first gear portion.

When the gear is referred to as a first gear, the supporter may further include a second gear configured to rotate in association with the first gear portion, and a third gear configured to rotate together with a rotation shaft of a drive motor and configured to rotate in association with the second gear portion.

A rotation axis of the first gear and a rotation axis of the second gear may be arranged in parallel with each other.

The rotation axis of the first gear and a rotation axis of the third gear may cross each other.

The first gear portion may include a spur gear.

The second gear portion may include a helical gear.

The second gear may include a spur gear.

The third gear may include a worm gear.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
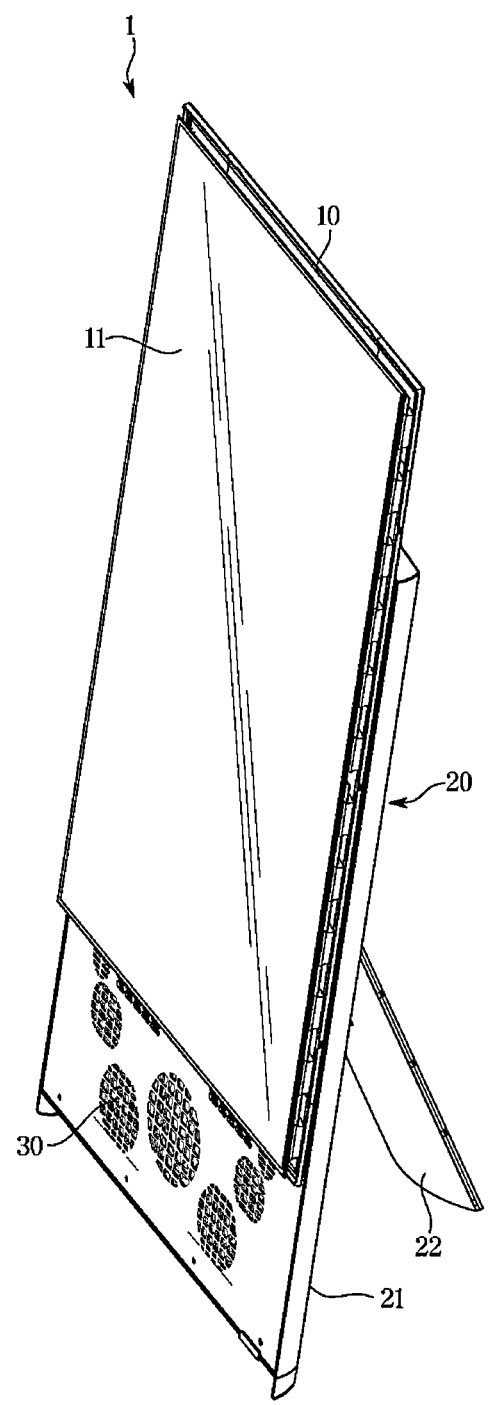
FIG. 1 is a perspective view of a display apparatus according to an embodiment of the disclosure.

Embodiments described in the disclosure and configurations shown in the drawings are merely examples of the embodiments of the disclosure, and may be modified in various different ways at the time of filing of the present application to replace the embodiments and drawings of the disclosure.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following detailed description, the terms of "front end", "rear end", "upper portion", "lower portion", "upper end", "lower end" and the like may be defined by the drawings, but the shape and the location of the component is not limited by the term.

Figure 2:
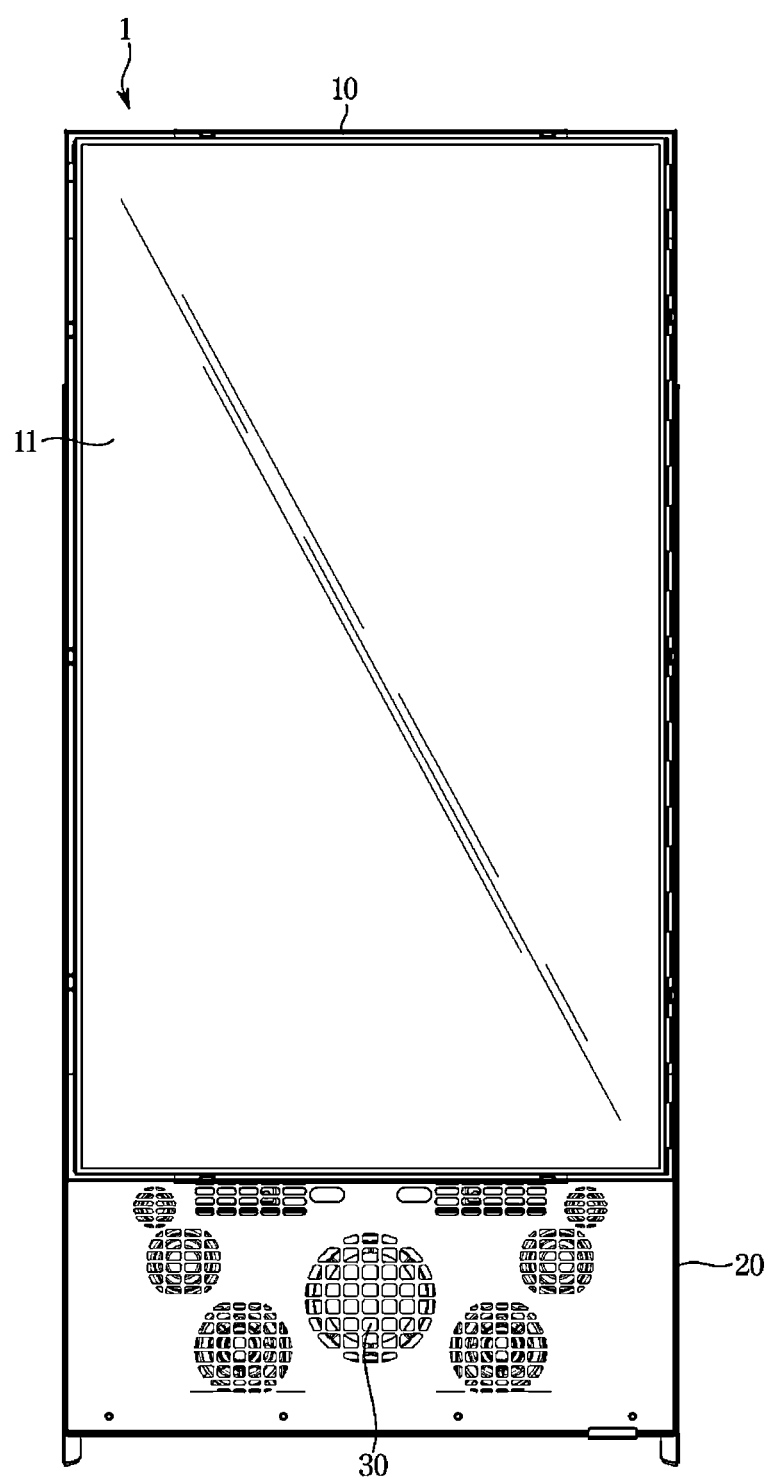
FIG. 2 is a front view of the display apparatus according to an embodiment of the disclosure, illustrating a state in which a display module is vertically arranged.
Figure 3:
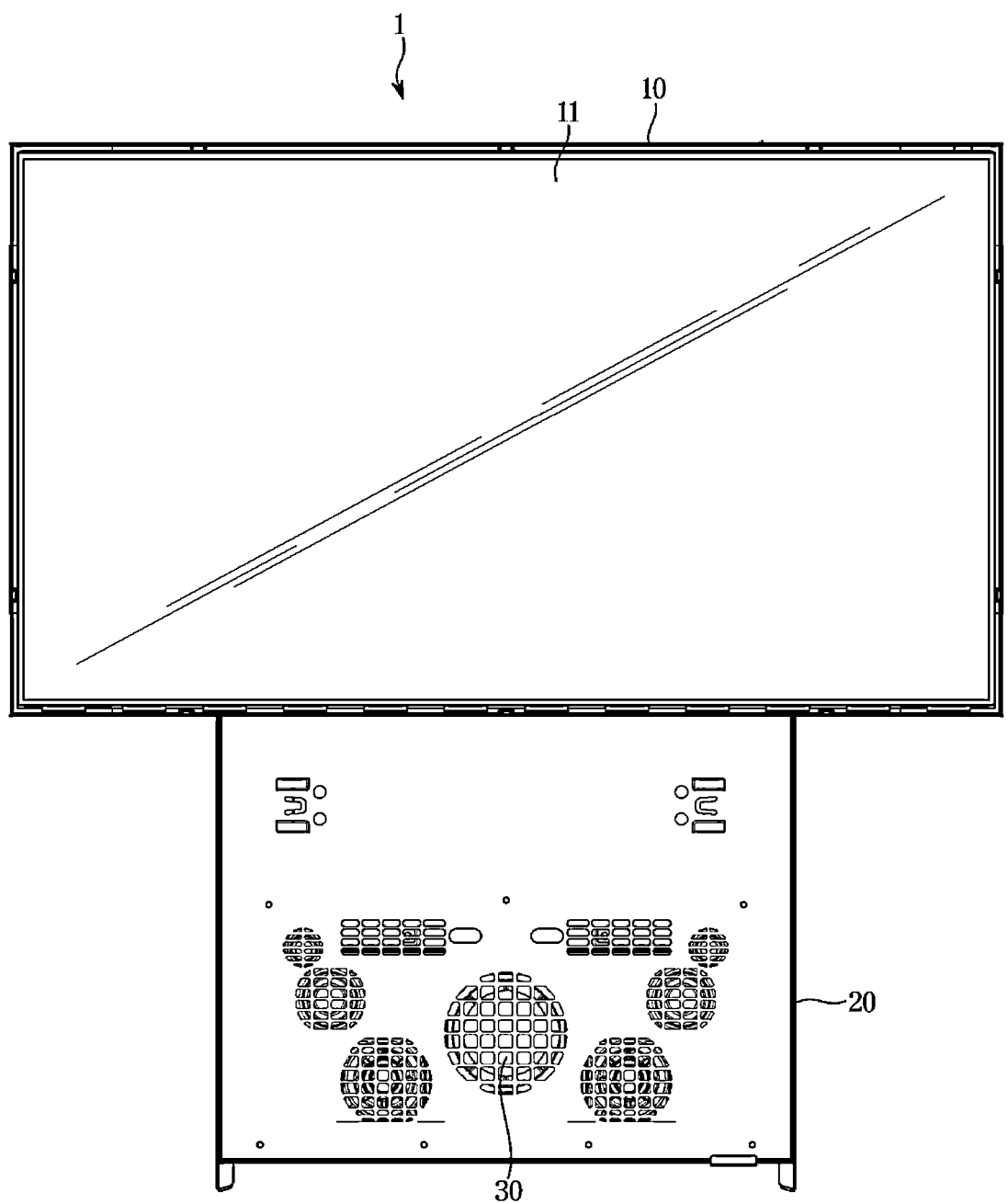
FIG. 3 is a front view of the display apparatus according to an embodiment of the disclosure, illustrating a state in which the display module is horizontally arranged.

The disclosure will be described more fully hereinafter with reference to the accompanying drawings FIG. 1 is a perspective view of a display apparatus according to an embodiment of the disclosure. FIG. 2 is a front view of the display apparatus according to an embodiment of the disclosure, illustrating a state in which a display module is vertically arranged. FIG. 3 is a front view of the display apparatus according to an embodiment of the disclosure, illustrating a state in which the display module is horizontally arranged.

Referring to FIG. 1, a display apparatus 1 may include a display module 10 (display) displaying a screen and a supporter 20 coupled to a rear of the display module 10 to support the display module 10.

The display module 10 is a device that displays information, materials, and data as text, graphics, graphs, and images, and may include a television and a monitor.

The display module 10 may be configured to display a screen. The display module 10 includes a self-emission type display panel (not shown) such as an organic light emitting diode (OLED) panel, or a non-self-emission type display panel (not shown) such as a liquid crystal display (LCD) panel, but is not limited thereto.

The display module 10 may be provided such that a horizontal length is different from a vertical length. That is, the display module 10 may be configured to have a long side and a short side. The display module 10 may be provided in a rectangular plate shape.

The supporter 20 may be coupled to the rear of the display module 10 to support the display module 10. The supporter 20 may include a support body 21 to which the display module 10 is coupled, and a stand 22 coupled to the rear of the support body 21. The supporter 20 may stand as the support body 21 and the stand 22 are in contact with the ground.

The supporter 20 may include a speaker 30 configured to generate sound. The speaker 30 may be arranged inside the support body 21. More particularly, the speaker 30 may be arranged in a lower portion of the support body 21. The speaker 30 may output sound together with the image displayed on the display module 10. In contrast, the speaker 30 may independently output sound even when the display module 10 is turned off. In addition, the speaker 30 may output a sound source reproduced by an external device (not shown) by being connected to the external device (not shown) by wire or wirelessly.

Referring to FIG. 2, the display module 10 may be arranged such that the long side is arranged vertically and the short side is arranged horizontally. Hereinafter this arrangement of the display module 10 is referred to as a vertical mode (portrait mode).

Referring to FIG. 3, the display module 10 may be arranged such that the long side is arranged horizontally and the short side is arranged vertically. Hereinafter this arrangement of the display module 10 is referred to as a horizontal mode (landscape mode).

A user may selectively arrange the display module 10 in the vertical mode or the horizontal mode according to an aspect ratio of an image.

Conventionally, the display module is generally fixed in a horizontal state. When the vertical image is displayed on the conventional display module, nothing is displayed on opposite sides of the screen, and thus the screen of the display module cannot be efficiently used. Recently, because both vertical and horizontal images are used, a display apparatus capable of efficiently displaying various aspect ratios is required.

According to an embodiment, the display apparatus 1 may arrange the display module 10 in the vertical mode upon displaying a vertical image, and the display apparatus 1 may arrange the display module 10 in the horizontal mode upon displaying a horizontal image, thereby effectively using a screen display area 11. Therefore, the display apparatus 1 according to an embodiment may efficiently display various aspect ratios.

Meanwhile, as illustrated in FIGS. 1 to 3, the speaker 30 may be arranged below the display module 10. The speaker 30 may be arranged not to be covered by the display module 10 even when the display module 10 is arranged in the vertical mode. Due to this arrangement, the speaker 30 may stably output sound regardless of the arrangement of the display module 10. In addition, although the drawings illustrate that the speaker 30 is seen from the outside of the supporter 20, a metal cover including a plurality of holes or a cover formed of a fabric material may be arranged in the front of the speaker.

Figure 4:
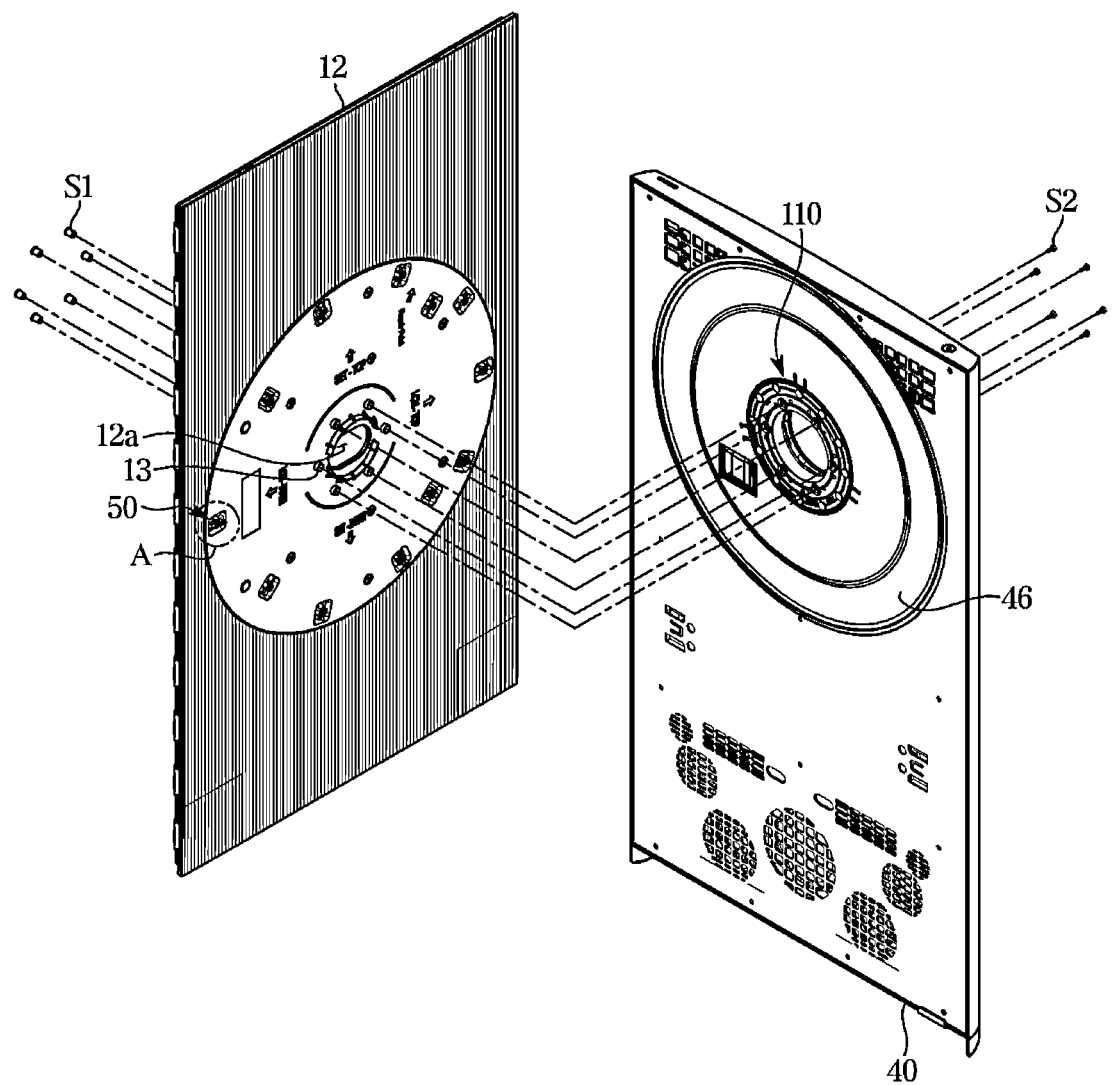
FIG. 4 is a view of the display apparatus according to an embodiment of the disclosure, illustrating a coupling structure between the display module and a supporter.

FIG. 4 is a view of the display apparatus according to an embodiment of the disclosure, illustrating a coupling structure between the display module and a supporter.

Referring to FIG. 4, the display module 10 may include a cover plate 12 forming a rear surface of the display module 10. The cover plate 12 may include a plate hole 12a formed at a center thereof and a plurality of first coupling portions 13 spaced apart along the circumference of the plate hole 12a. In addition, the cover plate 12 may include a roller 50 to be described later.

The supporter 20 may include a housing 40 forming a front surface of the supporter 20 and facing the display module 10, and a rotary holder 110 rotatable about the housing 40. The housing 40 may include a first guide 46 formed in the annular shape and configured to guide a movement of the roller 50.

As illustrated in FIG. 4, the cover plate 12 and the rotary holder 110 may be coupled to each other to rotate together. Particularly, after matching the coupling portion 13 of the cover plate 12 with a coupling portion (not shown) provided in the rotary holder 110, a first coupling member S1 of the cover plate 12 is coupled to the front side of the cover plate 12 and a second coupling member S2 is coupled to the rear side of the rotary holder 110 so that the cover plate 12 is coupled to the rotary holder 110. Alternatively, the cover plate 12 may be coupled to the rotary holder 110 by using only the second coupling member S2. When the cover plate 12 is coupled to the rotary holder 110, the cover plate 12 and the rotary holder 110 may rotate together.

Figure 5:
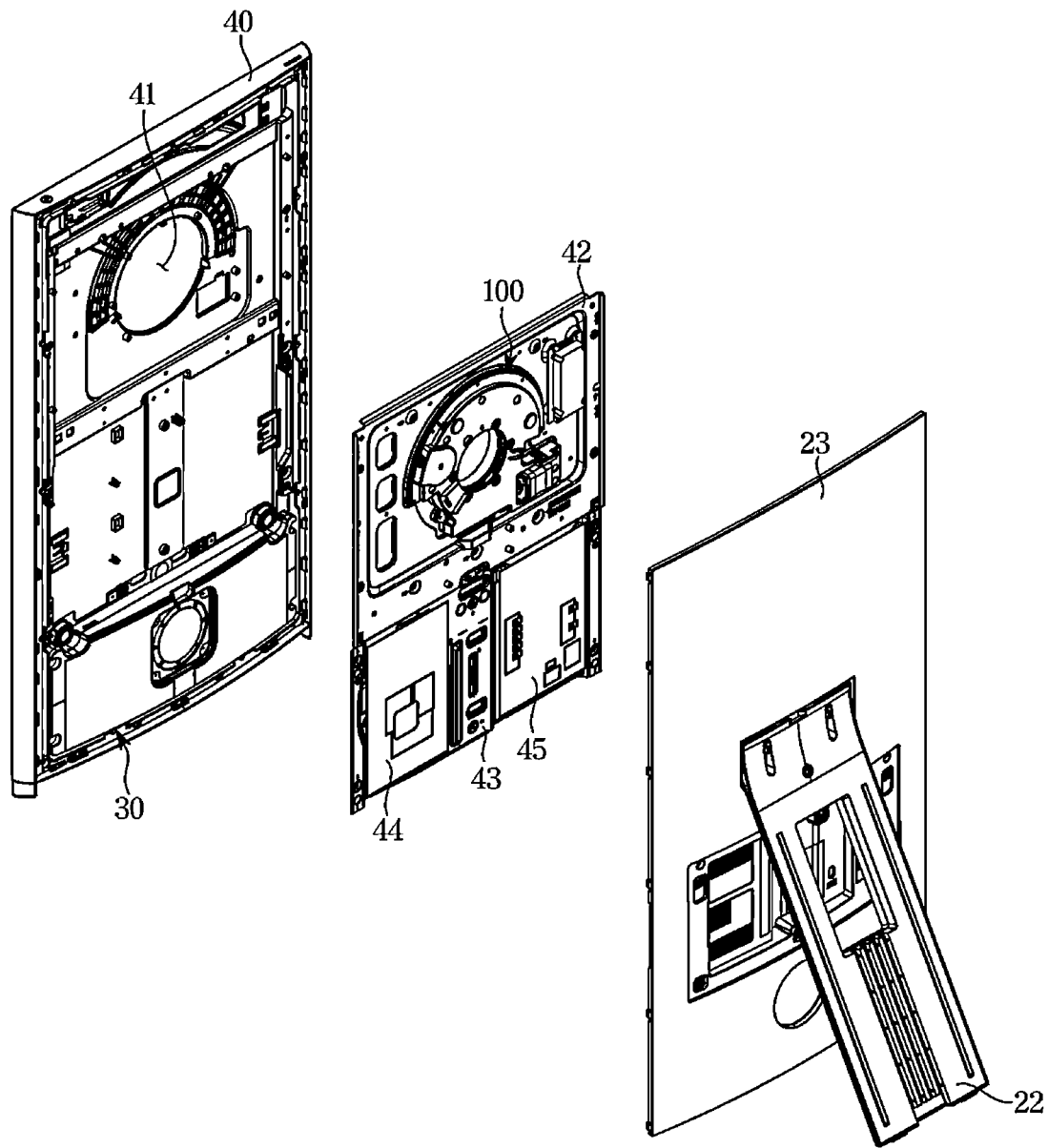
FIG. 5 is an exploded perspective view of the supporter in the display apparatus according to an embodiment of the disclosure.

FIG. 5 is an exploded perspective view of the supporter in the display apparatus according to an embodiment of the disclosure.

Referring to FIG. 5, the supporter 20 may include the housing 40 forming a front surface of the supporter 20 and having a rear surface that is opened, the speaker 30 coupled to a lower portion of the rear surface of the housing 40, a rotating device bracket 42 coupled to the rear surface of the housing 40, a printed circuit board bracket 43 arranged under the rotating device bracket 42 and the rear cover 23 covering the open rear surface of the housing 40.

The housing 40 may include a hole 41 configured to allow the rotary holder 110 to be inserted thereto and configured to pass through the housing 40. A rotating device 100 described later may be mounted to the rotating device bracket 42. As the rotating device bracket 42 is coupled to the housing 40, the rotating device 100 may be fixed to one side of the housing 40. A first printed circuit board 44 and a second printed circuit board 45 may be coupled to the printed circuit board bracket 43. Because the printed circuit board bracket 43 is coupled to the housing 40, the first printed circuit board 44 and the second printed circuit board 45 may be fixed to one side of the housing 40.

The stand 22 may be coupled to the rear cover 23. The rear cover 23 may cover the open rear surface of the housing 40 to form the rear surface of the supporter 20.

Figure 6:
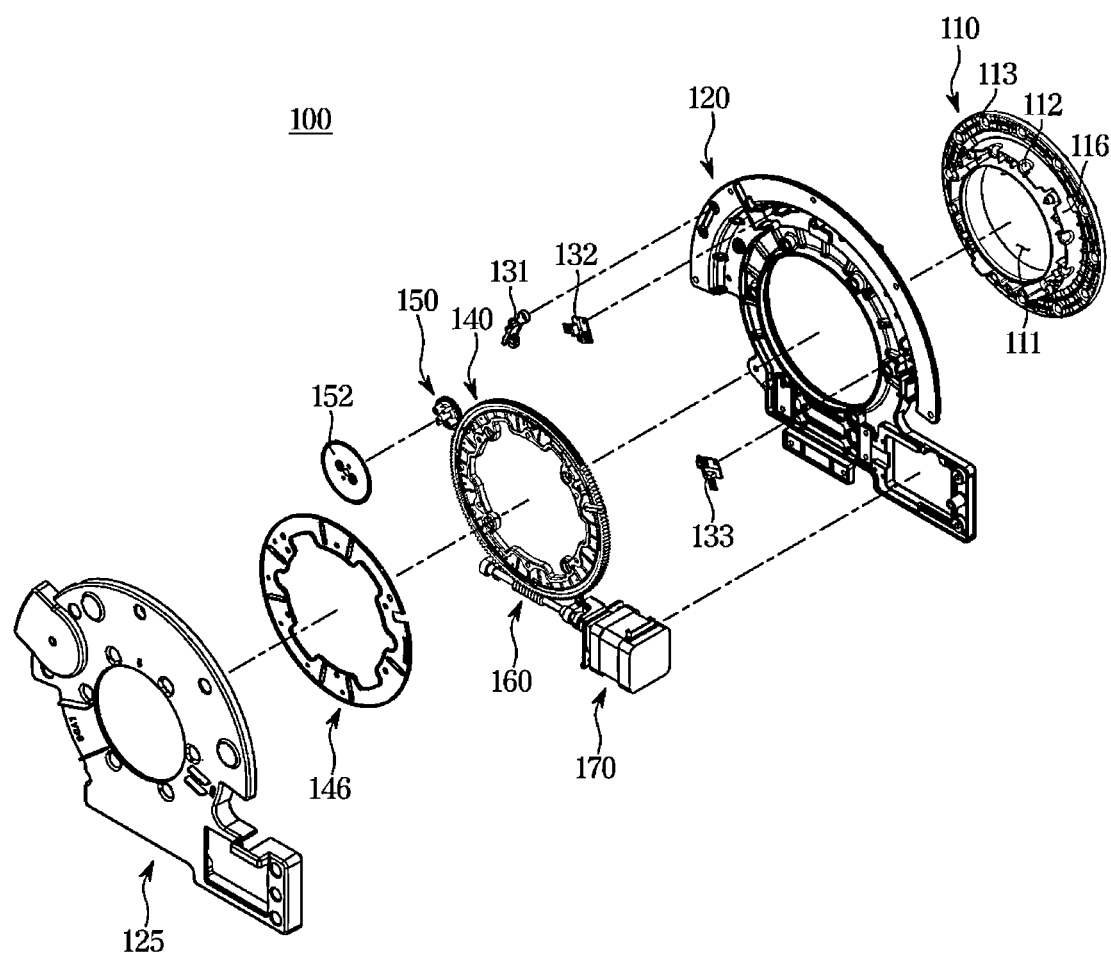
FIG. 6 is an exploded perspective view of a rotating device in the display apparatus according to an embodiment of the disclosure.

FIG. 6 is an exploded perspective view of a rotating device in the display apparatus according to an embodiment of the disclosure.

Referring to FIG. 6, the rotating device 100 may include the rotary holder 110 coupled to the display module 10 to rotate together with the display module 10, the fixed holder 120 fixed to one side of the housing 40, a detection sensor 131 coupled to the fixed holder 120, a switch 132 and 133, a first gear 140 coupled to the rotary holder 110 with the fixed holder 120 therebetween, a second gear 150 and a third gear 160 engaged with the first gear 140 to rotate together with the first gear 140, and the drive motor 170 configured to provide a driving force.

In addition, the rotating device 100 may include a disk 152 coupled to the second gear 150 to rotate together with the second gear 150, a reinforcing member 146 coupled to one surface of the first gear 140 to reinforce the strength of the first gear 140, and a holder cover 125 coupled to the rear surface of the fixed holder 120 to make a space in which the first gear 140, the second gear 150, and the third gear 160 are placed.

The function of each of the above components of the rotating device 100 will be described later.

Figure 7:
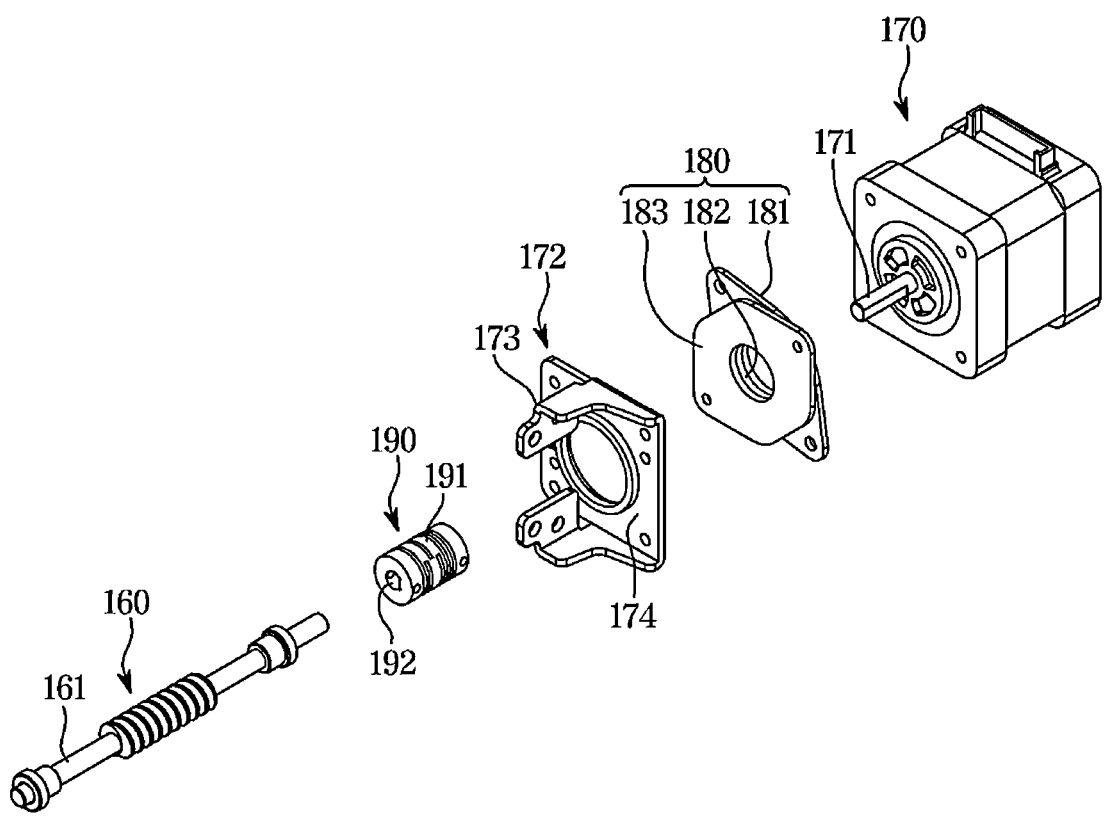
FIG. 7 is an exploded perspective view of some components including a drive motor in the display apparatus according to an embodiment of the disclosure.

FIG. 7 is an exploded perspective view of some components including a drive motor in the display apparatus according to an embodiment of the disclosure.

A coupling structure between the drive motor 170 and the third gear 160 will be described in detail with reference to FIG. 7.

Referring to FIG. 7, the drive motor 170 may include a rotary shaft 171, and the rotary shaft 171 may be rotated by a driving force of the drive motor 170. The drive motor 170 may be mounted on one side of the fixed holder 120 by a motor bracket 172.

The motor bracket 172 may be configured to fix the drive motor 170 to the fixed holder 120. The motor bracket 172 may include a holder coupler 173 and a damper coupler 174. The motor bracket 172 may be coupled to the fixed holder 120 through the holder coupler 173. The motor bracket 172 may be coupled to a damper 180 to be described later through the damper coupler 174, and may further be coupled to the drive motor 170.

The third gear 160 may be provided integrally with a gear shaft 161. The gear shaft 161 may be connected to the drive shaft 171 to rotate together with the drive shaft 171 of the drive motor 170 through a shaft connecting member 190.

The shaft connecting member 190 may include a first shaft groove 192 and a second shaft groove (not shown). The gear shaft 161 may be inserted into the first shaft groove 192, and the drive shaft 171 may be inserted into the second shaft groove. The gear shaft 161 may be prevented from rotating relative to the first shaft groove 192. For this, the gear shaft 161 may be provided as a d-cut shaft, and the first shaft groove 192 may also be provided to correspond to the d-cut. Alternatively, a separate coupling member may be used to rotate the shaft connecting member 190 and the gear shaft 161 together. In the same manner as the gear shaft 161 and the shaft connecting member 190, the drive shaft 171 and the shaft connecting member 190 may be coupled so as not to rotate relative to each other.

The shaft connecting member 190 may be provided in a substantially cylindrical shape. The shaft connecting member 190 may include a plurality of bending grooves 191 formed along the circumferential direction thereof. The plurality of bending grooves 191 may be spaced apart along the longitudinal direction of the shaft connecting member 190. In other words, the plurality of bending grooves 191 may be spaced apart along the axial direction of the gear shaft 161 or the drive shaft 171.

Because the shaft connecting member 190 includes the plurality of bending grooves 190, the gear shaft 161 and the drive shaft 171 may rotate together although the gear shaft 161 and the drive shaft 171 are not arranged side by side. The gear shaft 161 is coupled to one side of the shaft connecting member 190, the drive shaft 171 is coupled to the other side of the shaft connecting member 190, and the shaft connecting member 190 is configured to be flexible by the plurality of bending grooves 191. Due to the flexible characteristics of the shaft connecting member 190, the shaft connecting member 190 may connect the drive shaft 171 to the gear shaft 161 to allow the drive shaft 171 and the gear shaft 161 to rotate together although the drive shaft 171 and the gear shaft 161, which are coupled to opposite sides of the shaft connecting member 190, are not arranged in a line. The shaft connecting member 190 may be formed of a hard metal material such as aluminum.

The damper 180 may be arranged between the drive motor 170 and the motor bracket 172. The damper 180 may bring the motor bracket 172 into contact with the drive motor 170 to reduce transmission of vibration, which is generated by the drive motor 170, to the motor bracket 172. Further, the damper 180 may reduce noise generated by repeatedly contacting the drive motor 170 and the motor bracket 172 by vibration generated from the drive motor 170. That is, the damper 180 may reduce transmission of vibration and noise of the drive motor 170 to the motor bracket 172.

The damper 180 may include a motor coupler 181 coupled to the drive motor 170, a bracket coupler 183 coupled to the motor bracket 172, and a damping portion 182 arranged between the motor coupler 181 and the bracket coupler 183.

Although not shown in the drawings, the motor coupler 181 and the drive motor 170 may be coupled using a screw. In the same manner, the bracket coupler 183 and the damper coupler 174 of the motor bracket 172 may be coupled using a screw.

The damping portion 182 may be formed of a flexible material such as rubber or silicon. The damping portion 182 may absorb the vibration generated by the drive motor 170 to prevent the vibration from being transmitted to the motor coupler 181 and the bracket coupler 183. Accordingly, it is possible to reduce vibration and noise generated by the drive motor 170.

Figure 8:
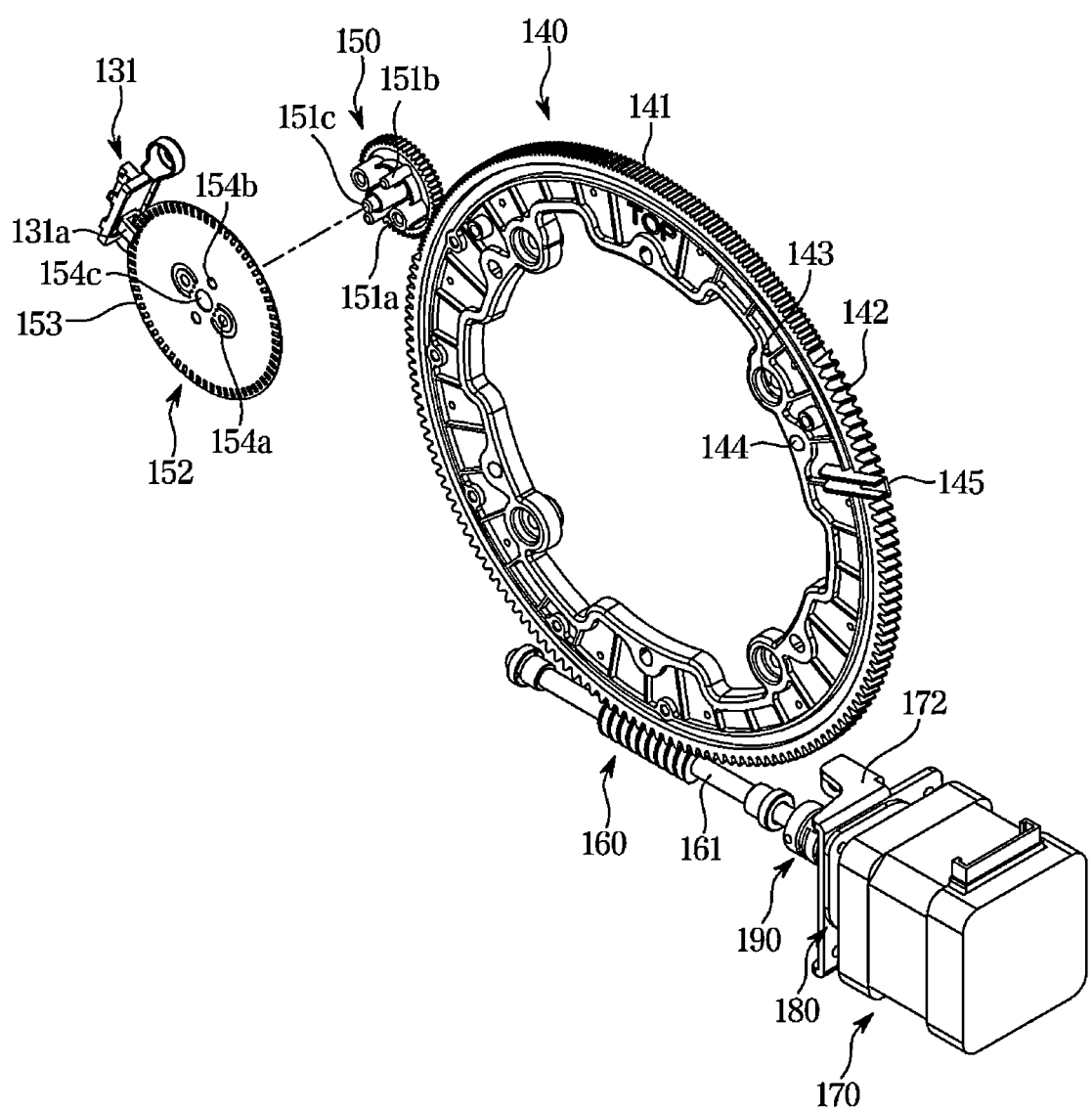
FIG. 8 is a view of some components including first to third gears in the display apparatus according to an embodiment of the disclosure.
Figure 9:
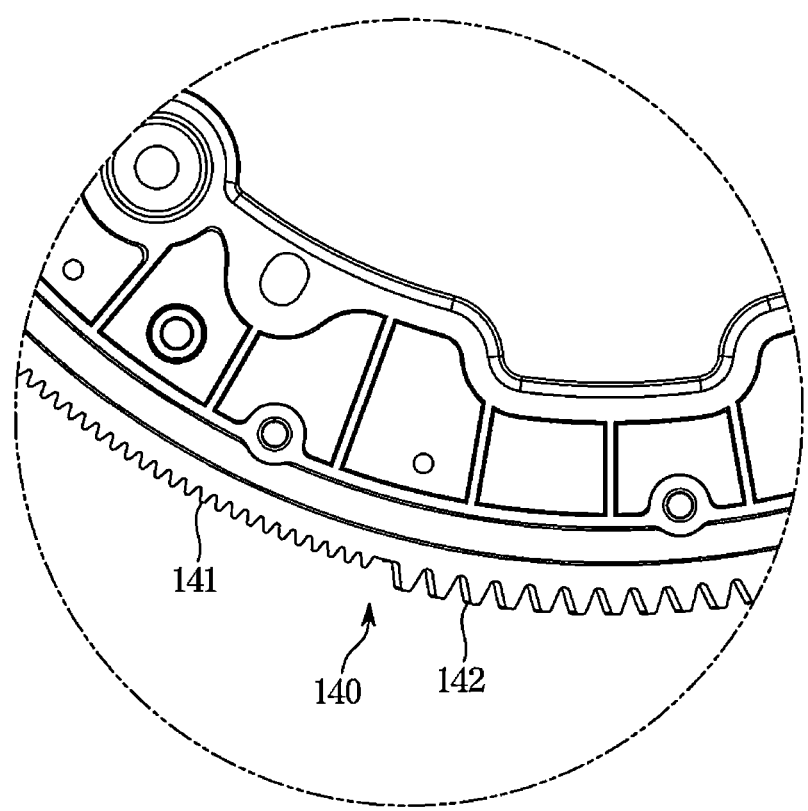
FIG. 9 is an enlarged view of a portion of the first gear in the display apparatus according to an embodiment of the disclosure.
Figure 10:
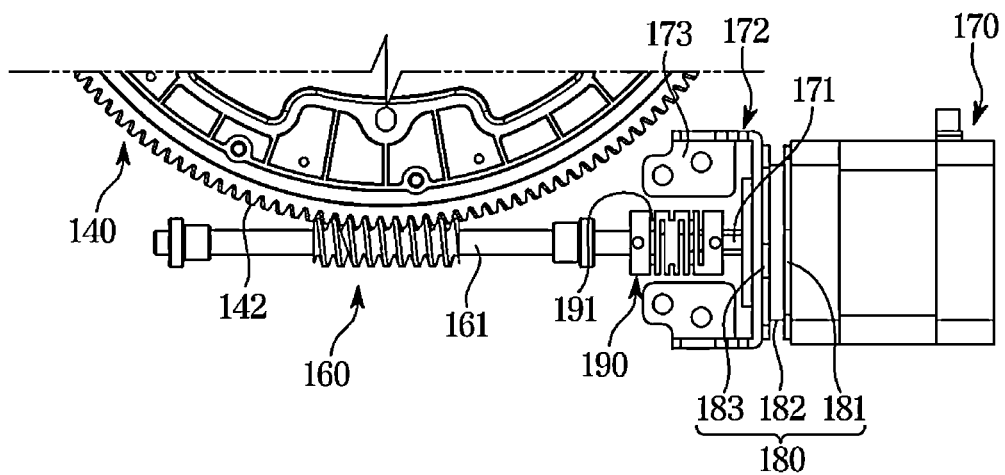
FIG. 10 is a view of a portion of the first gear, the third gear and the drive motor in the display apparatus according to an embodiment of the disclosure.

FIG. 8 is a view of some components including first to third gears in the display apparatus according to an embodiment of the disclosure. FIG. 9 is an enlarged view of a portion of the first gear in the display apparatus according to an embodiment of the disclosure. FIG. 10 is a view of a portion of the first gear, the third gear and the drive motor in the display apparatus according to an embodiment of the disclosure.

Hereinafter the first gear 140, the second gear 150, and the third gear 160 will be described in detail with reference to FIGS. 8 to 10.

Referring to FIG. 8, the first gear 140 may include a first gear portion 141 formed in one section of the circumferential surface of the first gear 140, and a second gear portion 142 formed in a remaining section of the circumferential surface of the first gear 140. The first gear 140 may include a first coupler 143 configured to couple the first gear 140 and the rotary holder 110, and a second coupler 144 configured to couple the first gear 140, the rotary holder 110, and the reinforcing member 146. Further, the first gear 140 may include a push protrusion 145 protruding in the radial direction of the first gear 140 further than the first gear portion 141 and the second gear portion 142.

The second gear 150 may include disk couplers 151a, 151b, and 151c configured to couple the disk 152 to the second gear 150. The disk couplers 151a, 151b, and 151c may include a first disk coupler 151a, a second disk coupler 151b, and a third disk coupler 151c. The first disk coupler 151a and the second disk coupler 151b are provided in pairs, respectively, and may extend along a direction parallel to the rotation axis of the second gear 150. The third disk coupler 151c may extend along the rotation axis of the second gear 150.

The disk 152 may be provided in a substantially disk shape. The disk 152 may include a plurality of slits 153 formed to have the same interval along an edge of the disk 152. The disk 152 may include disk holes 154a, 154b, and 154c corresponding to the disk couplers 151a, 151b, and 151c, respectively. The disk couplers 151a, 151b, and 151c may be inserted into the disc holes 154a, 154b, and 154c, respectively.

The detection sensor 131 may include an optical sensor 131a. The optical sensor 131a may include an optical transmitter and an optical receiver. The disk 152 may be arranged such that the edge of the disk 152 is placed between the optical transmitter and the optical receiver. By this arrangement, when the disk 152 rotates, the plurality of slits 153 passes between the optical transmitter and the optical receiver. When the slit 153 is arranged between the optical transmitter and the optical receiver, the light radiated from the optical transmitter may be received by the optical receiver. When the disk 152 is arranged between the optical transmitter and the optical receiver, the light irradiated from the optical transmitter is not received by the optical receiver. As the disk 152 rotates, a number of slits 153 pass the optical transmitter and the optical receiver, and the optical receiver receives light intermittently. The detection sensor 131 may detect a rotation amount of the disk 152 by detecting a reception pattern of the light. Because the disk 152 rotates with the second gear 150, the detection sensor 131 may detect the rotation amount of the second gear 150 by detecting the rotation amount of the disk 152. Further, because of the second gear 150 rotates with the first gear 140, the detection sensor 131 may detect the rotation amount of the first gear 140 by detecting the rotation amount of the second gear 150. Therefore, the detection sensor 131 may detect the rotation amount of the first gear 140.

Referring to FIGS. 9 and 10, the first gear 140 may include the first gear portion 141 and the second gear portion 142. The first gear portion 141 and the second gear portion 142 may have different tooth shape. The first gear portion 141 and the second gear portion 142 may be provided with different types of gears. In addition, the first gear portion 141 and the second gear portion 142 may have different pitches. For example, the first gear portion 141 may be provided as a spur gear. The second gear portion 142 may be provided as a helical gear. However, this is merely an example, and thus the first gear portion and the second gear portion may include various types of gears different from each other. For example, a pitch of the first gear portion 141 may be 0.5 mm, and a pitch of the second gear portion 142 may be 1.0 mm. However, this is merely an example, and the first gear portion and the second gear portion may have a larger or smaller pitch than the above mentioned pitch.

As mentioned above, as for the first gear 140 according to an embodiment, the first gear portion 141 may be formed in one section of the circumferential surface of the first gear 140, and the second gear portion 142 may be formed in a remaining section of the circumferential surface of the first gear 140. Accordingly, the first gear 140 may have a smaller depth than that of a conventional gear. The depth may mean a length in the front-rear direction of the gear.

Conventionally, in order to implement two gears having different teeth, it is common to use two gears having the same rotation axis. Because a double gear is only a combination of two different gears, its depth is approximately twice that of a single gear. When the depth of the gear is large, the thickness of the product becomes large, which may act as a factor to prevent the thinning of the display module.

According to an embodiment, the first gear 140 may be provided as a single gear and its depth may be significantly less than a conventional double gear. The first gear 140 may be implemented by a single gear including two gear portions having different tooth shape, thereby reducing the depth thereof. Therefore, it is possible to reduce a thickness of the display module 10. Accordingly, it is possible to provide a thin display module.

Hereinafter a case in which the first gear portion 141 is provided as a spur gear and the second gear portion 142 is provided as a helical gear will be described as an example. In addition, it is assumed that the pitch of the first gear 141 is 0.5 mm and the pitch of the second gear 142 is 1.0 mm.

When the first gear portion 141 is provided as a spur gear, the gear portion of the second gear 150 engaged with the first gear portion 141 may also be provided as a spur gear. In addition, when the pitch of the first gear portion 141 is 0.5 mm, the pitch of the gear portion of the second gear 150 may also be 0.5 mm.

When the second gear portion 142 is provided as a helical gear, the third gear 160 rotating in engagement with the second gear portion 142 may be provided as a worm gear. In addition, when the pitch of the second gear portion 142 is 1.0 mm, the pitch of the gear portion of the third gear 160 may also be 1.0 mm.

As the second gear portion 142 is provided as a helical gear and the gear portion of the third gear 160 is provided as a worm gear, the rotation axis of the first gear 140 and the rotation axis of the third gear 160 cross each other. In contrast, the rotation axis of the second gear 150 and the rotation axis of the first gear 140 may be arranged in parallel with each other.

Because the pitch of the first gear portion 141 is smaller than the pitch of the second gear portion 142, the second gear 150 rotating in engagement with the first gear portion 141 may rotate relatively precisely. When the pitch of the gear portion is small, the gear may rotate at a constant speed. As described above, the detection sensor 131 may be configured to detect the rotation amount of the disk 152 that rotates together with the second gear 150. The detection sensor 131 may easily detect the rotation amount of the disk 152 when the disk 152 rotates at a constant speed. Therefore, because the pitch of the first gear portion 141 is smaller than the pitch of the second gear portion 142, the second gear 150 and the disk 152 may rotate at a relatively constant speed, and thus the detection performance of the detection sensor 141 may be improved.

Figure 11:
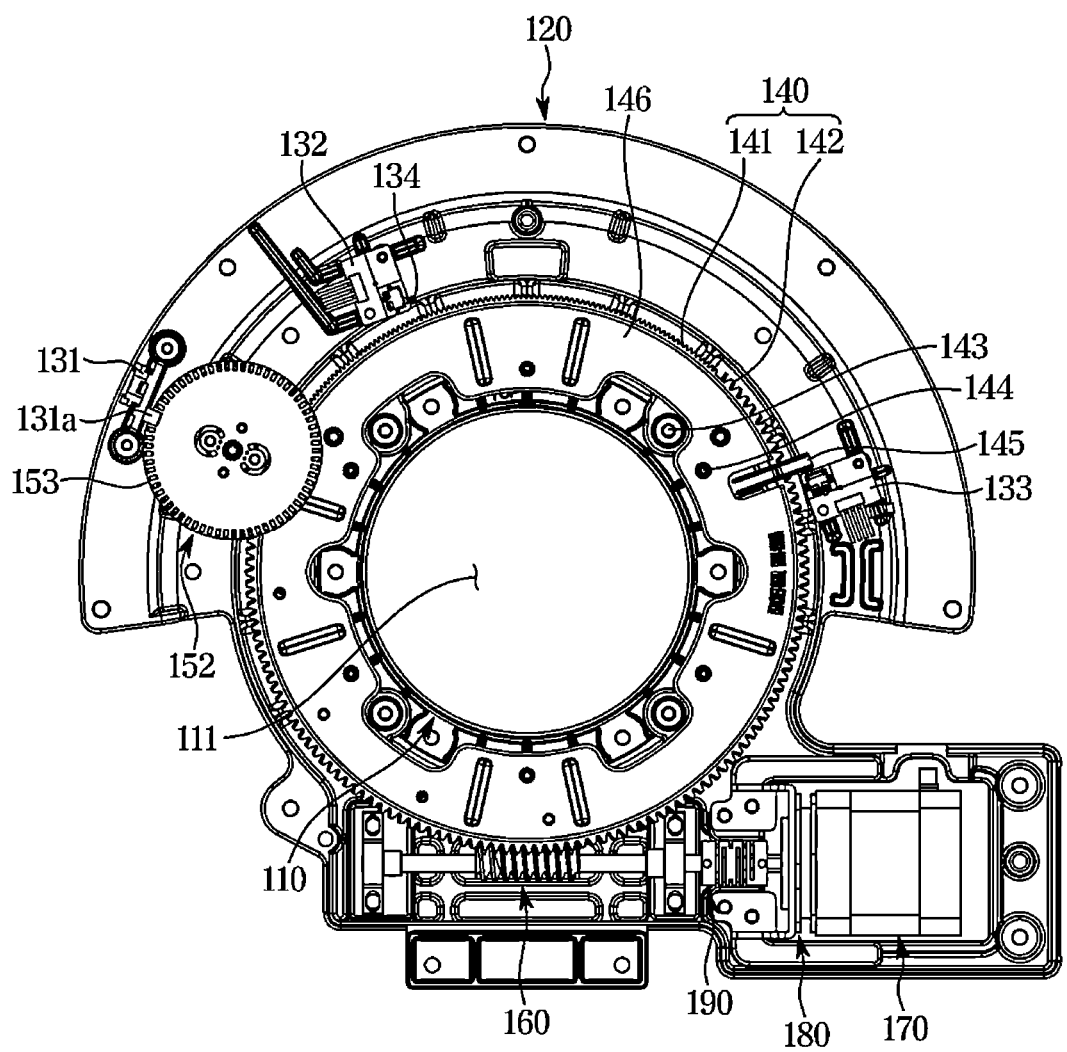
FIG. 11 is a view of the rotating device when the display module is vertically arranged in the display apparatus according to an embodiment of the disclosure.
Figure 12:
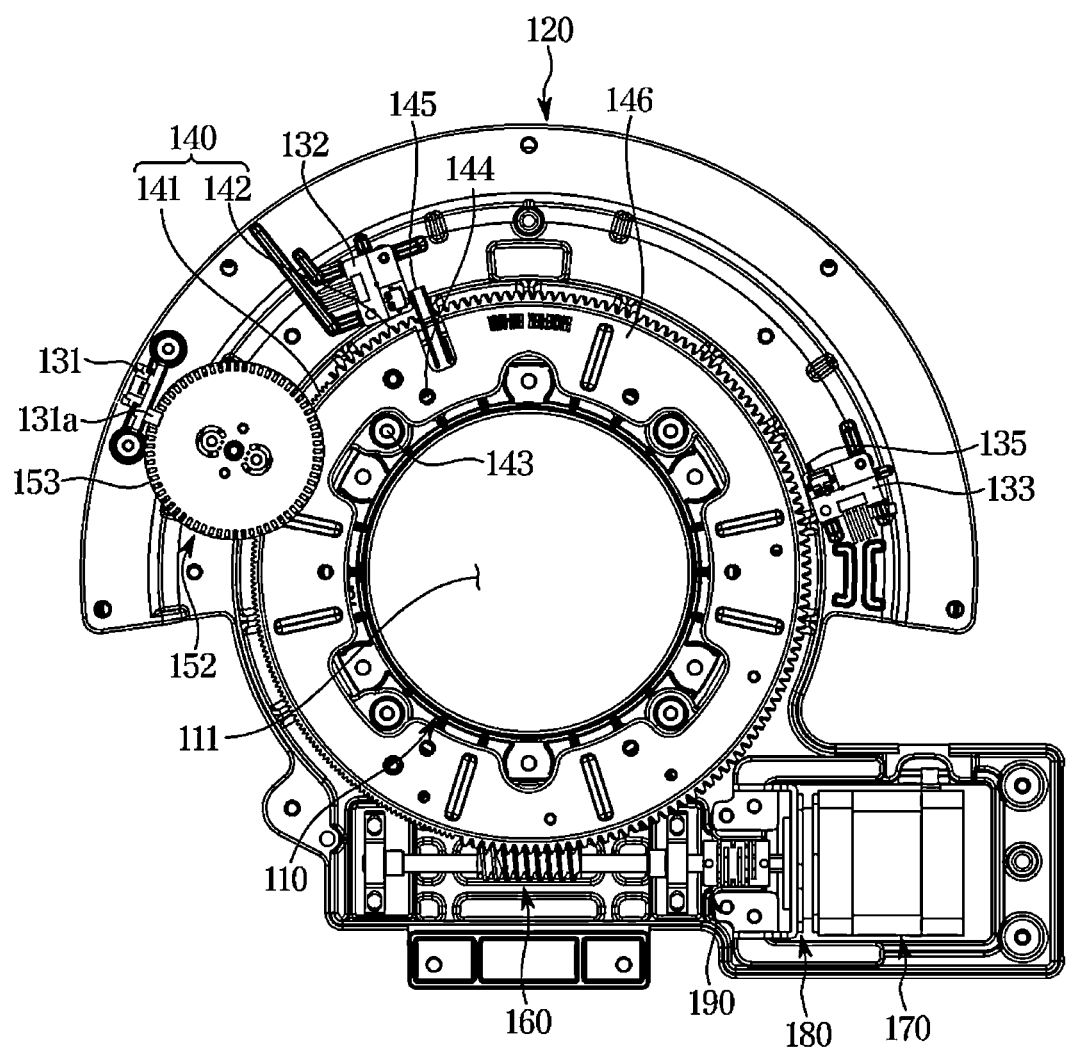
FIG. 12 is a view of the rotating device when the display module is horizontally arranged in the display apparatus according to an embodiment of the disclosure.

FIG. 11 is a view of the rotating device when the display module is vertically arranged in the display apparatus according to an embodiment of the disclosure. FIG. 12 is a view of the rotating device when the display module is horizontally arranged in the display apparatus according to an embodiment of the disclosure.

Hereinafter the operation of the rotating device 100 will be described with reference to FIGS. 11 and 12.

Referring to FIGS. 11 and 12, the first gear 140 may be configured to rotate clockwise or counterclockwise within a predetermined range. The first gear 140 may rotate clockwise or counterclockwise by receiving a driving force from the drive motor 170 through the third gear 160.

Referring to FIG. 11, the first gear 140 may rotate clockwise to push a button 135 (refer to FIG. 12) of the second switch 133. Particularly, the push protrusion 145 of the first gear 140 may push the button 135 of the second switch 133 as the first gear 140 rotates clockwise. Hereinafter the button 135 of the second switch 133 is referred to as a second button 135.

When the second button 135 is pushed, the second switch 133 may transmit an input signal indicating that the second button 135 is pushed to a controller (not shown). The controller (not shown) may control the drive motor 170 to stop the operation of the drive motor 170 when the input signal is received from the second switch 133. By this control process, the first gear 140 no longer rotates clockwise, and the display module 10 may be maintained in the vertical mode.

Referring to FIG. 12, the first gear 140 may rotate counterclockwise to push a button 134 (refer to FIG. 11) of the first switch 132. Particularly, the push protrusion 145 of the first gear 140 may push the button 134 of the first switch 132 as the first gear 140 rotates counterclockwise. Hereinafter the button 134 of the first switch 132 is referred to as a first button 134.

When the first button 134 is pushed, the first switch 132 may transmit an input signal indicating that the first button 134 is pushed to the controller (not shown). The controller (not shown) may control the drive motor 170 to stop the operation of the drive motor 170 when the input signal is received from the first switch 132. By this control process, the first gear 140 no longer rotates counterclockwise, and the display module 10 may be maintained in the horizontal mode.

Meanwhile, as for the display apparatus 1 according to an embodiment of the disclosure, during the display module 10 rotates, the rotation of the display module 10 may be disturbed by a user or other objects.

For example, when the display module 10 rotates from the vertical mode to the horizontal mode, the user may hold the display module 10 with his or her hand to prevent rotation of the display module 10. In this case, by detecting the rotation amount of the second gear 150, the detection sensor 131 may detect that the rotation of the second gear 150 is slowed, or the rotation of the display module 10 is stopped. The detection sensor 131 may transmit an input signal indicating that the rotation of the display module 10 is slowed or stopped to the controller (not shown). Upon receiving the input signal, the controller (not shown) may control the drive motor 170 so that the operation of the drive motor 170 is stopped or the rotary shaft of the drive motor 170 is rotated in an opposite direction.

Therefore, when the rotation is interrupted during the display module 10 rotates from the horizontal mode to the vertical mode, the display module 10 may stop the rotation thereof or rotate in the opposite direction to return to the horizontal position corresponding to the original position. On the contrary, when the rotation is interrupted during the display module 10 rotates from the vertical mode to the horizontal mode, the display module 10 may stop the rotation thereof or rotate in the opposite direction to return to the vertical position corresponding to the original position.

In addition, although a user attempts to physically rotate the display module 10, the display module 10 may not rotate during the operation. That is, when the user tries to rotate the display module 10 by using a certain force, the display module 10 may maintain its position. For this, the drive motor 170 may be maintained in a locked state so that the drive shaft 171 does not rotate.

Further, when the power supply of the display apparatus 1 is stopped, the display module 10 may be rotated upon receiving a physical force that is applied from the outside. For example, when the location of the display apparatus 1 is changed, the drive shaft of the drive motor 170 may be not locked, and a user may rotate the display module 10 by applying a certain force.

Figure 13:
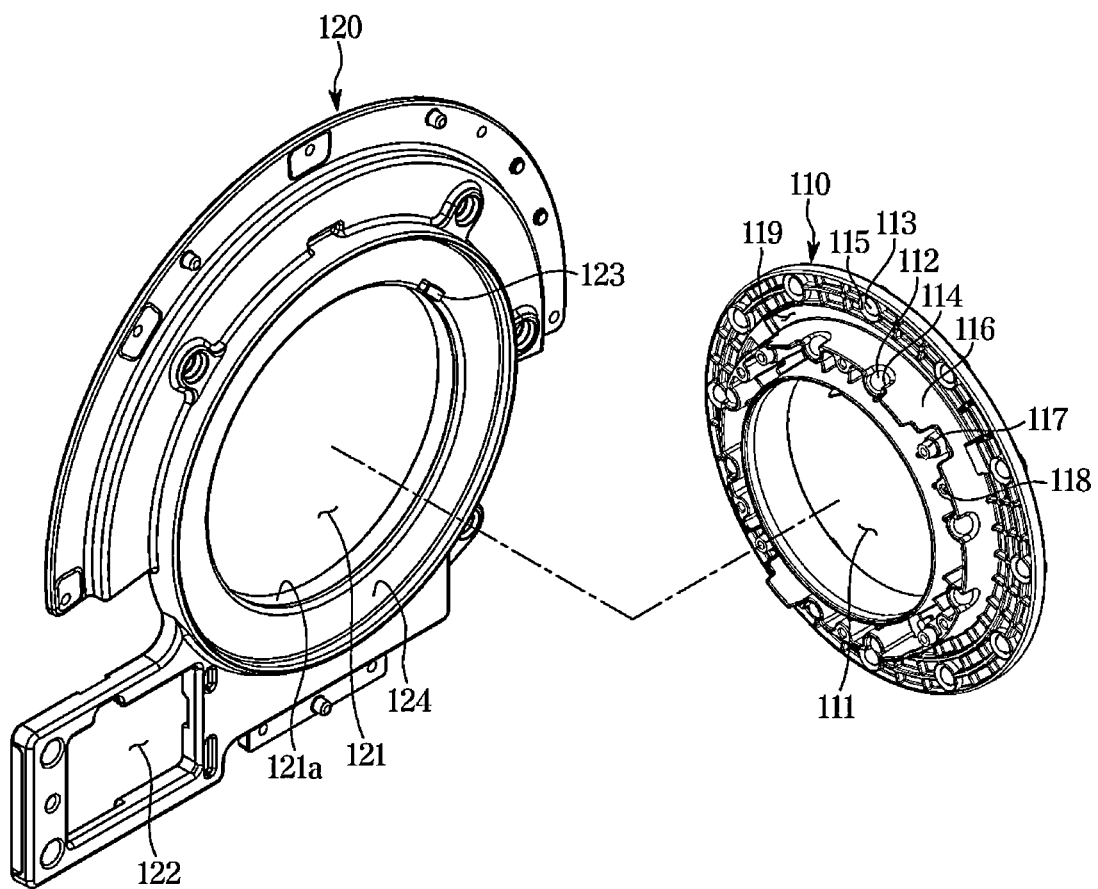
FIG. 13 is a view illustrating a state in which a fixed holder and a rotary holder are separated from each other, in the display apparatus according to an embodiment of the disclosure.
Figure 14:
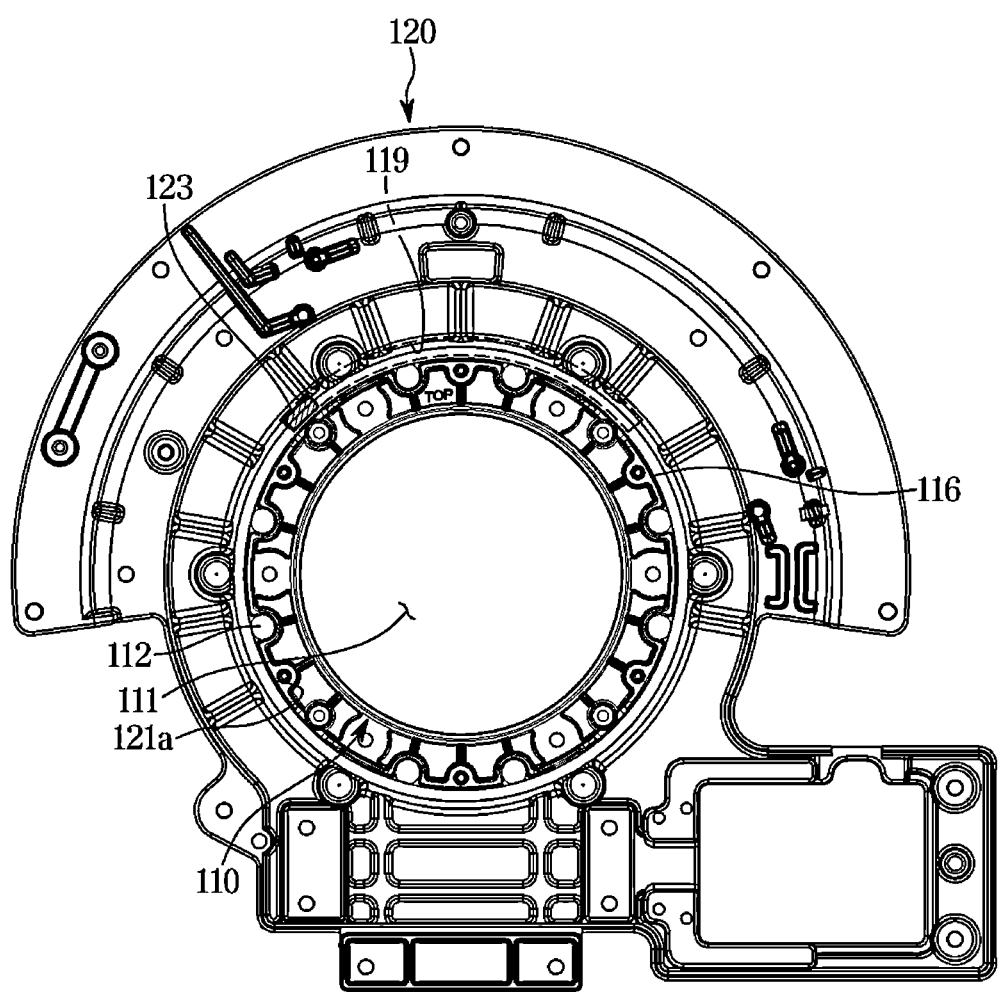
FIG. 14 is a view illustrating the fixed holder and the rotary holder in the display apparatus according to an embodiment of the disclosure.

FIG. 13 is a view illustrating a state in which a fixed holder and a rotary holder are separated from each other, in the display apparatus according to an embodiment of the disclosure. FIG. 14 is a view illustrating the fixed holder and the rotary holder in the display apparatus according to an embodiment of the disclosure.

Referring to FIG. 13, the rotary holder 110 may be coupled to the fixed holder 120 to be rotatable relative to the fixed holder 120. While the fixed holder 120 is maintained to be fixed to one side of the supporter 20, the rotary holder 110 may rotate clockwise or counterclockwise with respect to the fixed holder 120.

A rotation guide plurality of balls 112 and 113 may be provided to facilitate the rotation of the rotary holder 110 upon the rotation of the rotary holder 110 with respect to the fixed holder 120, and to reduce noise and vibration generated when the rotation of the rotary holder 110.

The rotation guide may be configured to guide a rotation of the rotary holder 110 with respect to the fixed holder 120. The rotation guide may reduce noise and vibration generated when the rotation holder 110 with respect to the fixed holder 120. The rotation guide may be provided in various forms. For example, as shown in FIG. 13, the rotation guide may include a number of balls 112 and 113. Alternatively, the rotation guide may include a plurality of rollers (not shown).

As well as maintaining a distance between the rotary holder 110 and the fixed holder 120, the rotation guide may reduce a friction between the rotary holder 110 and the fixed holder 120 when the rotary holder 110 rotates, so as to allow the rotary holder 110 to smoothly rotate.

Hereinafter a plurality of balls will be described as an example of the rotation guide.

The balls 112 and 113 may include a first ball 112 and a second ball 113. The first ball 112 and the second ball 113 may be provided in the same size, alternatively, may be provided in different sizes.

The rotary holder 110 may include a first ball groove 114 to which the first ball 112 is inserted and a second ball groove 115 to which the second ball 113 is inserted. While being accommodated in the first ball groove 114, the first ball 112 may relatively rotate in the first ball groove 114. While being accommodated in the second ball groove 115, the second ball 113 may relatively rotate in the second ball groove 115.

The rotary holder 110 may include a through hole 111 penetrating the center of the rotary holder 110. The rotary holder 110 may include a partition wall 116 extending along a circumference of the through hole 111 in a direction parallel to the rotation axis of the rotary holder 110. In addition, the rotary holder 110 may include a third coupler 117 coupled to the first coupler 143 of the first gear 140, and a fourth coupler 118 coupled to the second coupler 144 of the first gear 140. In addition, the rotary holder 110 may include a protrusion groove 119 forming a path on which a limiting protrusion 123 to be described later moves.

The fixed holder 120 may include a first hole 121 to which the rotary holder 110 is inserted and a second hole 122 to which the drive motor 170 is inserted. An inner wall 121a may be provided around the first hole 121 to allow the first ball 112 to be in contact therewith. On one side of the first hole 121, the limiting protrusion 123 configured to limit the rotation range of the rotary holder 110 may be provided. Further, the fixed holder 120 may include a second guide 124 formed along the circumference of the first hole 121 to guide a movement of the second ball 113.

When the rotary holder 110 is coupled to the fixed holder 120, the first ball 112 may rotate in contact with the inner wall 121a of the fixed holder 120. When the rotary holder 110 is coupled to the fixed holder 120, the second ball 113 may rotate in contact with the second guide 124. The first ball 112 and the second ball 113 may serve as a bearing.

According to an embodiment, the fixed holder 120 may mechanically limit the rotation range of the rotary holder 110.

As described above, when the first button 134 and the second button 135 are pushed, the first switch 132 and the second switch 133 may transmit a push input signal to the controller (not shown). The controller (not shown) may stop the operation of the drive motor 170 upon receiving the push input signal. However, when the first switch 132 or the second switch 133 does not operate normally, the drive motor 170 may continue to rotate clockwise or counterclockwise, which may cause the failure of the display apparatus 1.

In order to prevent this, a method for limiting the rotation of the rotary holder 110 although the first switch 132 or the second switch 133 does not operate normally, may be required.

Referring to FIGS. 13 and 14, the limiting protrusion 123 of the fixed holder 120 may be inserted into the protrusion groove 119. The fixed holder 120 and the limiting protrusion 123 may be provided to be fixed at a predetermined position. When the rotary holder 110 rotates, the protrusion groove 119, which is provided in the rotary holder 110, may rotate clockwise or counterclockwise according to the rotation of the rotary holder 110. When the first switch 132 or the second switch 133 operates normally, the limiting protrusion 123 may not be in contact with one end or the other end of the protrusion groove 119. However, the first switch 132 or the second switch 133 does not operate normally, the limiting protrusion 123 may be in contact with the end or the other end of the protrusion grooves 119 according to the rotation direction of the rotary holder 110. That is, when the operation of the drive motor 170 is not stopped because the first switch 132 or the second switch 133 does not operate normally, the limiting protrusion 123 may be in contact with one end or the other end of the protrusion groove 119. When the limiting protrusion 123 is in contact with one end or the other end of the protruding groove 119, the rotation of the rotary holder 110 may be limited. The limiting protrusion 123 may physically limit the rotation range of the rotary holder 110. The drive motor 170 may be set to rotate the rotary holder 110 with a predetermined force and further set to stop the operation of the rotary holder 110 when the rotary holder 110 does not rotate although the predetermined force is applied. Accordingly, although the first switch 132 and/or the second switch 133 does not operate normally, the display module 10 may be arranged in the horizontal mode or the vertical mode normally. The driving force of the drive motor 170 may be set smaller than the force required for separating the fixed holder 120 from the supporter 20. That is, the driving force of the drive motor 170 may be set to prevent the fixed holder 120 from being separated from the supporter 20. Therefore, although the switches 132 and 133 do not operate normally, the rotation range of the rotary holder 110 may be limited by the interference between the limiting protrusion 123 and the protrusion groove 119.

Figure 15:
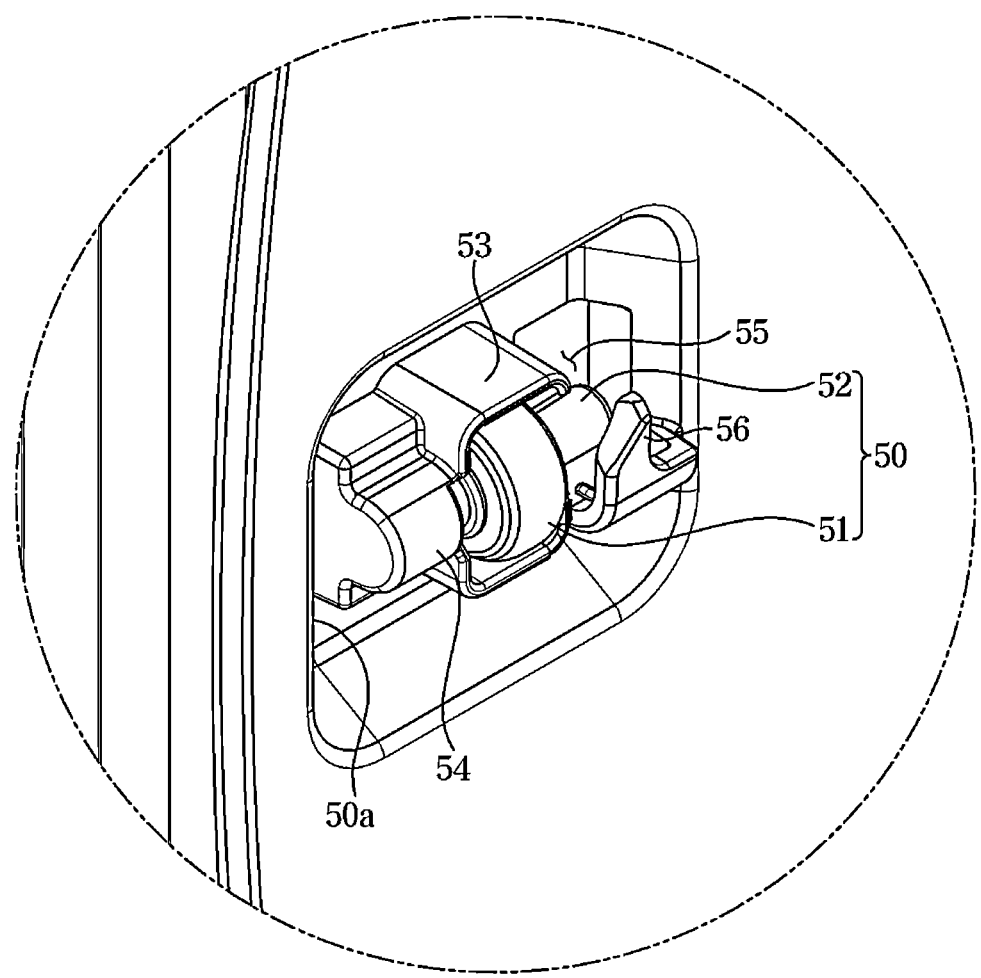
FIG. 15 is an enlarged view of a portion A of FIG. 4.
Figure 16:
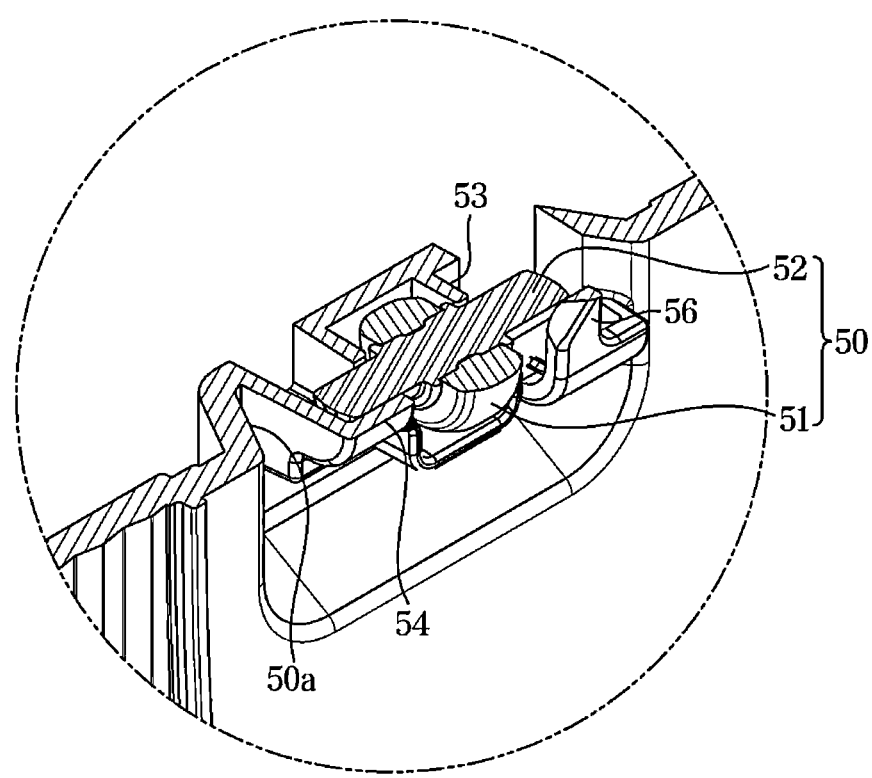
FIG. 16 is a cross-sectional perspective view of FIG. 15.
Figure 17:
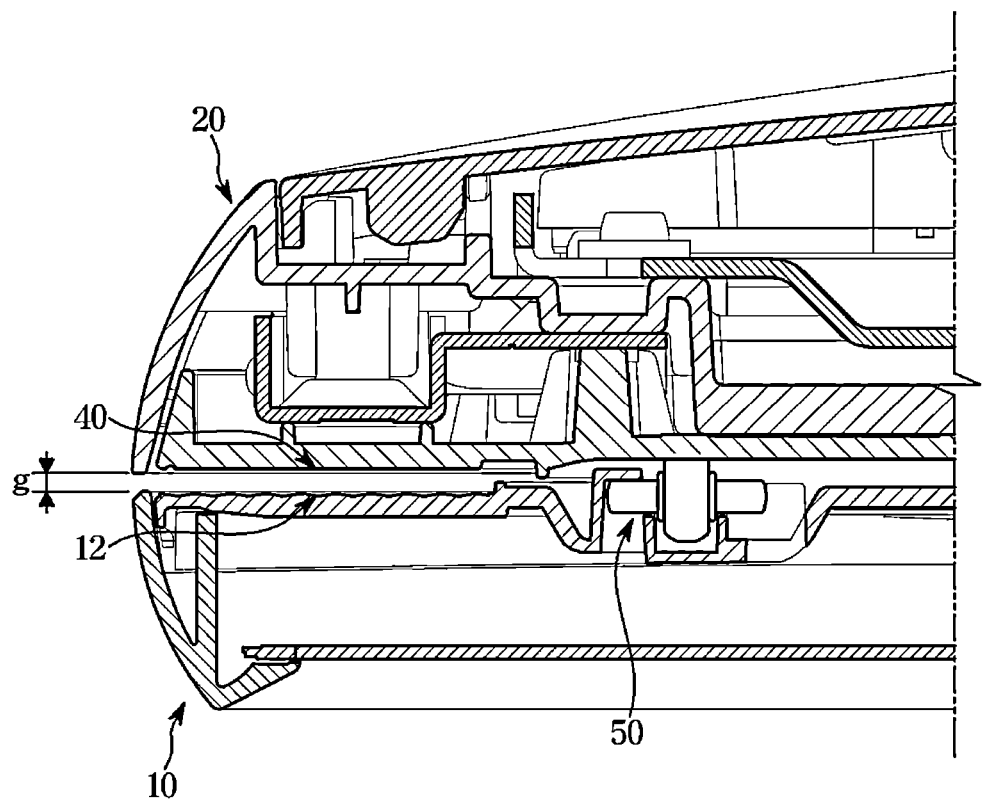
FIG. 17 is a view illustrating a portion of a cross section of the display apparatus according to an embodiment of the disclosure.

FIG. 15 is an enlarged view of a portion A of FIG. 4. FIG. 16 is a cross-sectional perspective view of FIG. 15. FIG. 17 is a view illustrating a portion of a cross section of the display apparatus according to an embodiment of the disclosure.

Hereinafter the roller 50 will be described in detail with reference to FIGS. 15 to 17.

Referring to FIGS. 15 and 16, a plurality of rollers 50 may be provided on the cover plate 12 of the display module 10. Particularly, a plurality of roller grooves 50a may be formed in the cover plate 12, and the roller grooves 50a may be formed to be recessed inward of the cover plate 12.

The roller 50 may include a rolling portion 51 and a shaft 52. The rolling portion 51 may be formed of a flexible material such as rubber and silicon to absorb shocks. The roller 50 may be coupled to the roller groove 50a to be relatively rotatable without a separate coupling member. For this, ribs 53 and 54 and an insertion space 55 may be provided in the roller groove 50a.

The ribs 53 and 54 may include a first rib 53 preventing the rolling portion 51 from being separated from the roller groove 50a, and a second rib 54 preventing one end of the shaft 52 from being separated from the roller groove 50a. A shaft supporter 56 supporting the other end of the shaft 52 may be provided in the roller groove 50a. The insertion space 55 configured to allow the roller 50 to be inserted into the inside of the ribs 53 and 54 without a separate coupling member may be provided between the shaft supporter 56 and the roller groove 50a.

Referring to FIG. 4, by being in contact with the first guide 46 and then rolling, the roller 50 may facilitate the rotation of the display module 10 and reduce noise and vibration generated when the display module 10 rotates.

Referring to FIG. 17, the display apparatus 1 may maintain a predetermined gap g between the display module 10 and the supporter 20. When the gap g is not maintained between the display module 10 and the supporter 20, the display module 10 and the supporter 20 may be in contact with each other, which may cause friction or noise. According to an embodiment, as illustrated in FIG. 17, because the roller 50 is arranged between the cover plate 12 of the display module 10 and the housing 40 of the supporter 20, the predetermined gap g may be maintained between the cover plate 12 and the housing 40. Accordingly, the display apparatus according to an embodiment may prevent the noise caused by the contact between the display module and the supporter.

Figure 18:
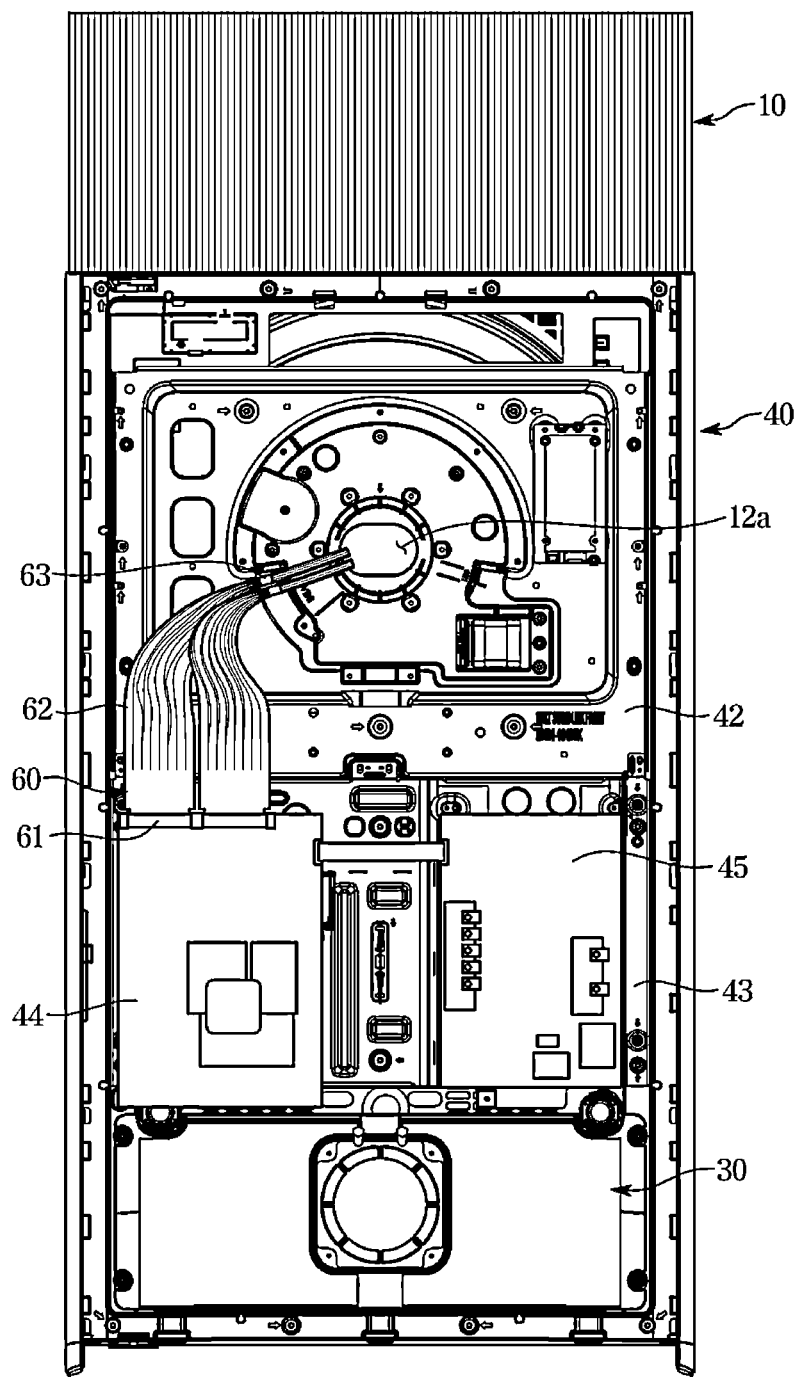
FIG. 18 is a rear view of the display apparatus according to an embodiment of the disclosure, illustrating a state in which a rear cover of the supporter is removed.

FIG. 18 is a rear view of the display apparatus according to an embodiment of the disclosure, illustrating a state in which a rear cover of the supporter is removed.

Referring to FIG. 18, the display apparatus 1 according to an embodiment may include a flexible printed circuit board 60 configured to electrically connect the display module 10 to the supporter 20.

One end of the flexible printed circuit board 60 may be electrically connected to the first printed circuit board 44 provided in the supporter 20. In addition, although not shown in the drawings, the other end of the flexible printed circuit board 60 may be electrically connected to the printed circuit board (not shown) provided at the display module 10 through the plate hole 12a of the cover plate. That is, the flexible printed circuit board 60 may be connected to the inside of the supporter 20 from the inside of the display module 10 by passing through the rear surface of the display module 10 and the front surface of the supporter 20.

The flexible printed circuit board 60 may include a connector 62 provided between one end portion 61 and the other end portion (not shown). The connector 62 may be cut into a plurality of branches along the direction in which the flexible printed circuit board 60 extends. In addition, a tie portion 63 configured to tie the connector 62, which are cut into a plurality branches and then put together, may be provided at one side of the connector 62.

According to an embodiment, because the flexible printed circuit board 60 includes the connector 62 cut into several branches and the tie portion 63 configured to put together and tie the connector 62, it is possible to reduce noise caused by the friction between the flexible printed circuit board and the display module or the supporter upon the rotation of the display module 10. When the flexible printed circuit board is not cut into several branches, the flexible printed circuit board may be twisted when the display module rotates, which may cause the friction between the flexible printed circuit board and the display module or the supporter. According to an embodiment, because the connector of the flexible printed circuit board except for opposite ends thereof is cut into several branches, it is possible to prevent the twist of the flexible printed circuit board and to prevent the noise caused by the contact between the flexible printed circuit board and the display module or the supporter.

Figure 19:
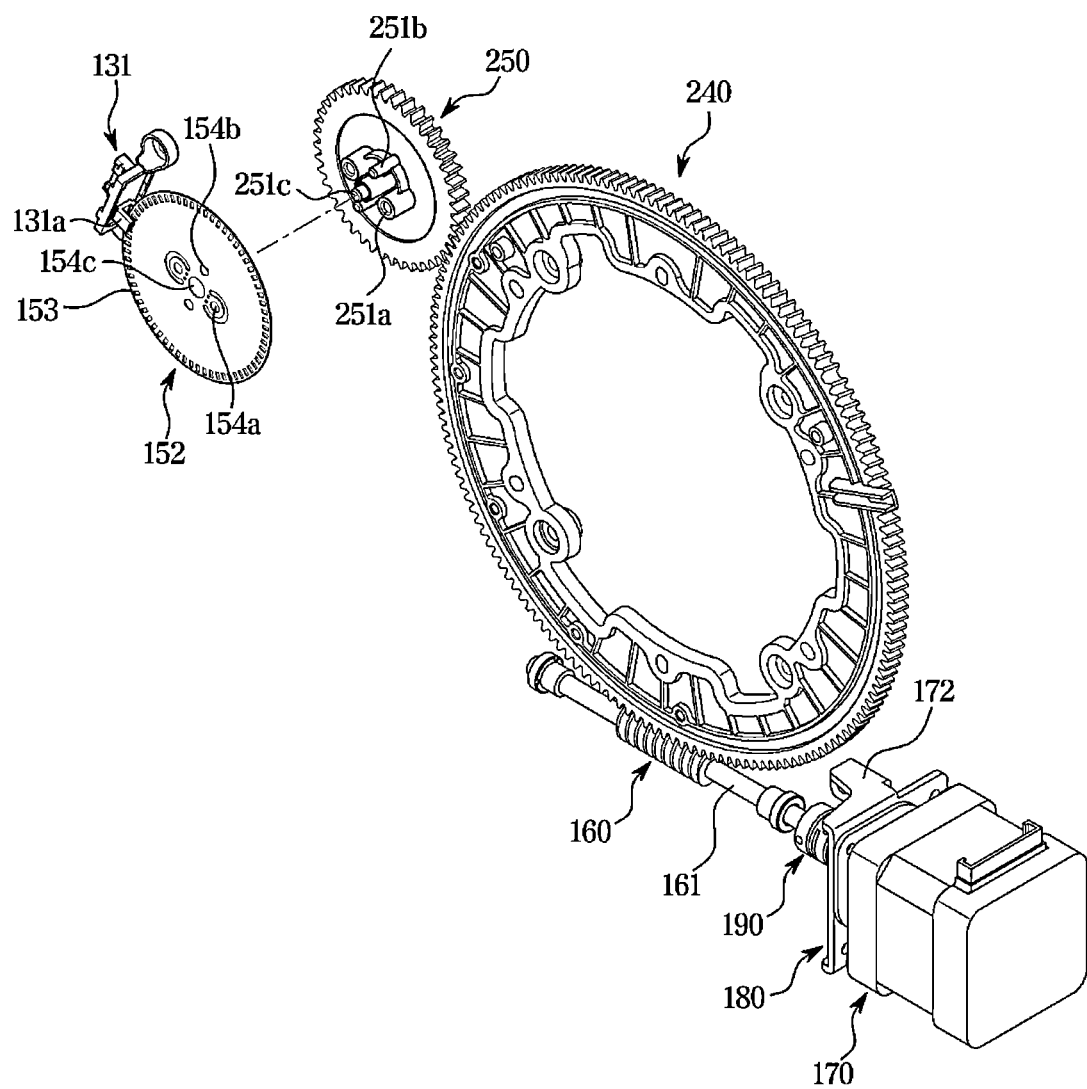
FIG. 19 is a view illustrating some components including gears in a display apparatus according to another embodiment of the disclosure.

FIG. 19 is a view illustrating some components including gears in a display apparatus according to another embodiment of the disclosure.

Referring to FIG. 19, a display apparatus according to another embodiment of the disclosure may include a fourth gear 240 and a fifth gear 250 having a structure different from the above-described first gear 140 and second gear 150. Other configurations are the same as the above description, and thus redundant descriptions will be omitted.

According to another embodiment, the fourth gear 240 may be provided to have the same tooth shape. The fourth gear 240 may be provided as a helical gear. The fifth gear 250 may be configured to rotate in engagement with the fourth gear 240, and may be provided as a helical gear like the fourth gear 240. Therefore, the fourth gear 240 and the fifth gear 250 may have the same pitch to engage with each other so as to rotate with each other.

According to another embodiment, the fourth gear 240 may rotate by receiving a driving force from a drive motor 170 through a third gear 160, and the fifth gear 250 may rotate together with the fourth gear 240.

The fifth gear 250 may include disk couplers 251a, 251b, and 251c configured to couple a disk 152 to the fifth gear 250. As described above, the disk couplers 251a, 251b, and 251c may be inserted into disk holes 154a, 154b, and 154c, respectively, and thus the fifth gear 250 and the disk 152 may be coupled to each other.

A detection sensor 131 may detect a rotation amount of the fifth gear 250, and a method of detecting the rotation amount of the fifth gear 250 by the detection sensor 131 may be the same as the method of detecting the rotation amount of the second gear 150 by the detection sensor 131. Therefore, a detailed description thereof will be omitted.

Figure 20:
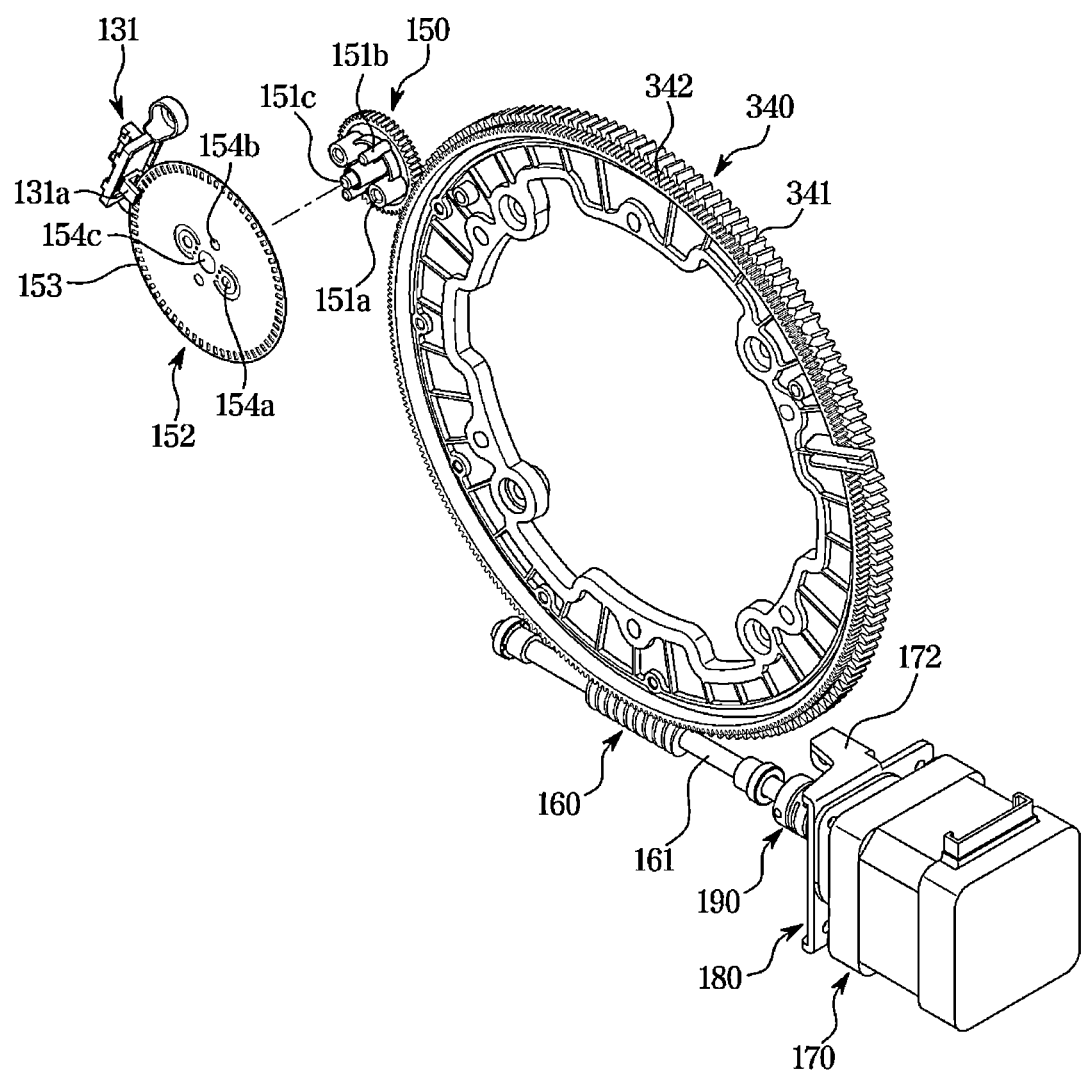
FIG. 20 is a view illustrating some components including gears in a display apparatus according to still another embodiment of the disclosure.

FIG. 20 is a view illustrating some components including gears in a display apparatus according to still another embodiment of the disclosure.

Referring to FIG. 20, a display apparatus according to still another embodiment of the disclosure may include a sixth gear 340 having a structure different from the above-described first gear 140. Other configurations are the same as the above description, and thus redundant descriptions will be omitted.

According to still another embodiment, the sixth gear 340 may be provided as a double gear including gear portions 341 and 342 having different tooth shape in the axial direction.

The sixth gear 340 may include a third gear portion 341 provided as a helical gear and a fourth gear portion 342 provided as a spur gear. As illustrated in FIG. 20, the third gear portion 341 and the fourth gear portion 342 may be spaced apart along the axial direction of the sixth gear 340.

The third gear portion 341 may be provided as a helical gear. Accordingly, the third gear portion 341 may engage and rotate with a third gear 160, and receive the driving force of the drive motor 170 through the third gear 160.

The fourth gear portion 342 may be provided as a spur gear. Accordingly, the fourth gear portion 342 may engage and rotate together with a second gear 150. As described above, a detection sensor 131 may detect a rotation amount of the second gear 150 by detecting a rotation amount of a disk 152 rotating together with the second gear 150.

Figure 21:
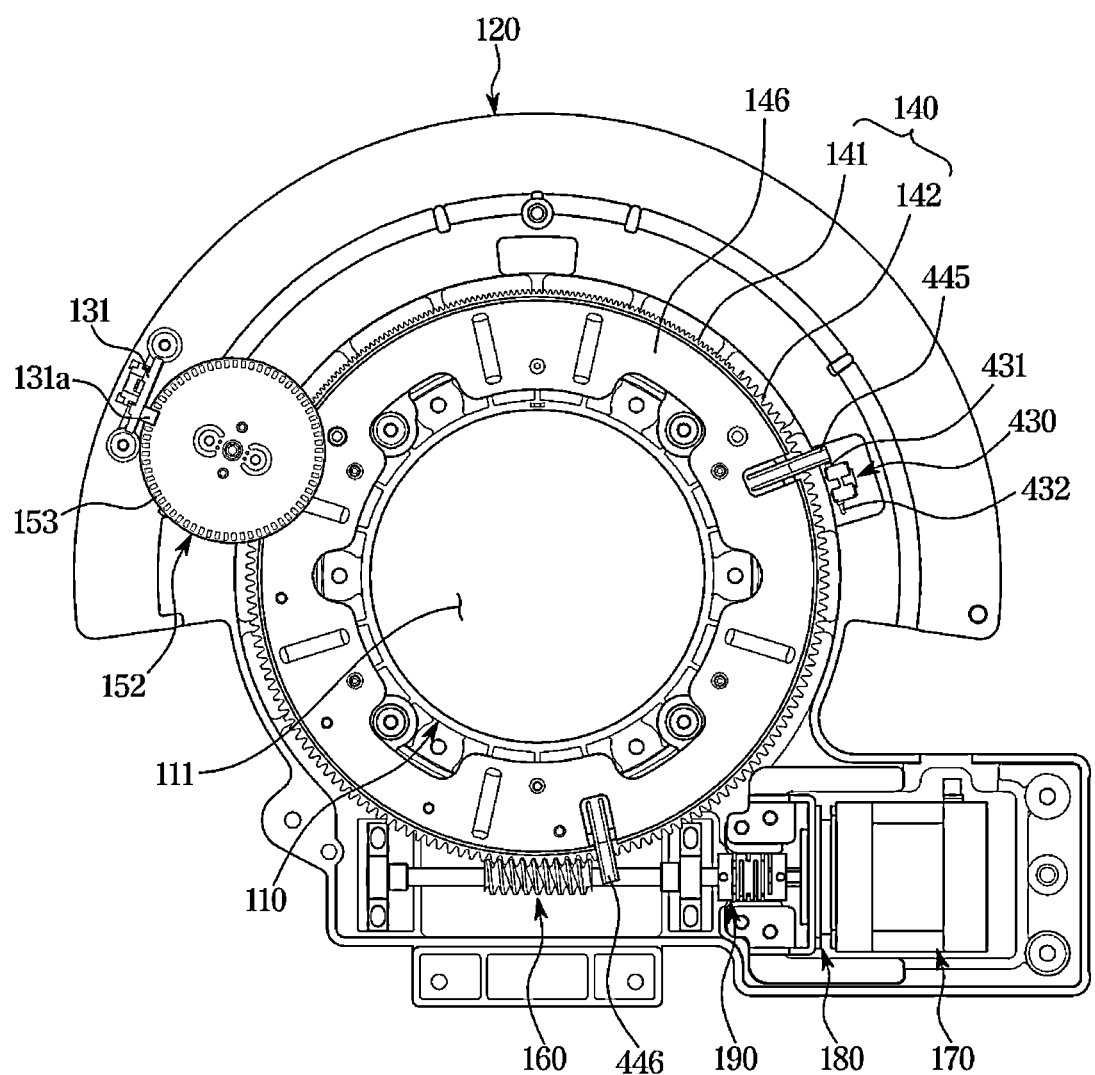
FIG. 21 is a view illustrating a rotating device when a display module is vertically arranged in a display apparatus according to still another embodiment of the disclosure.
Figure 22:
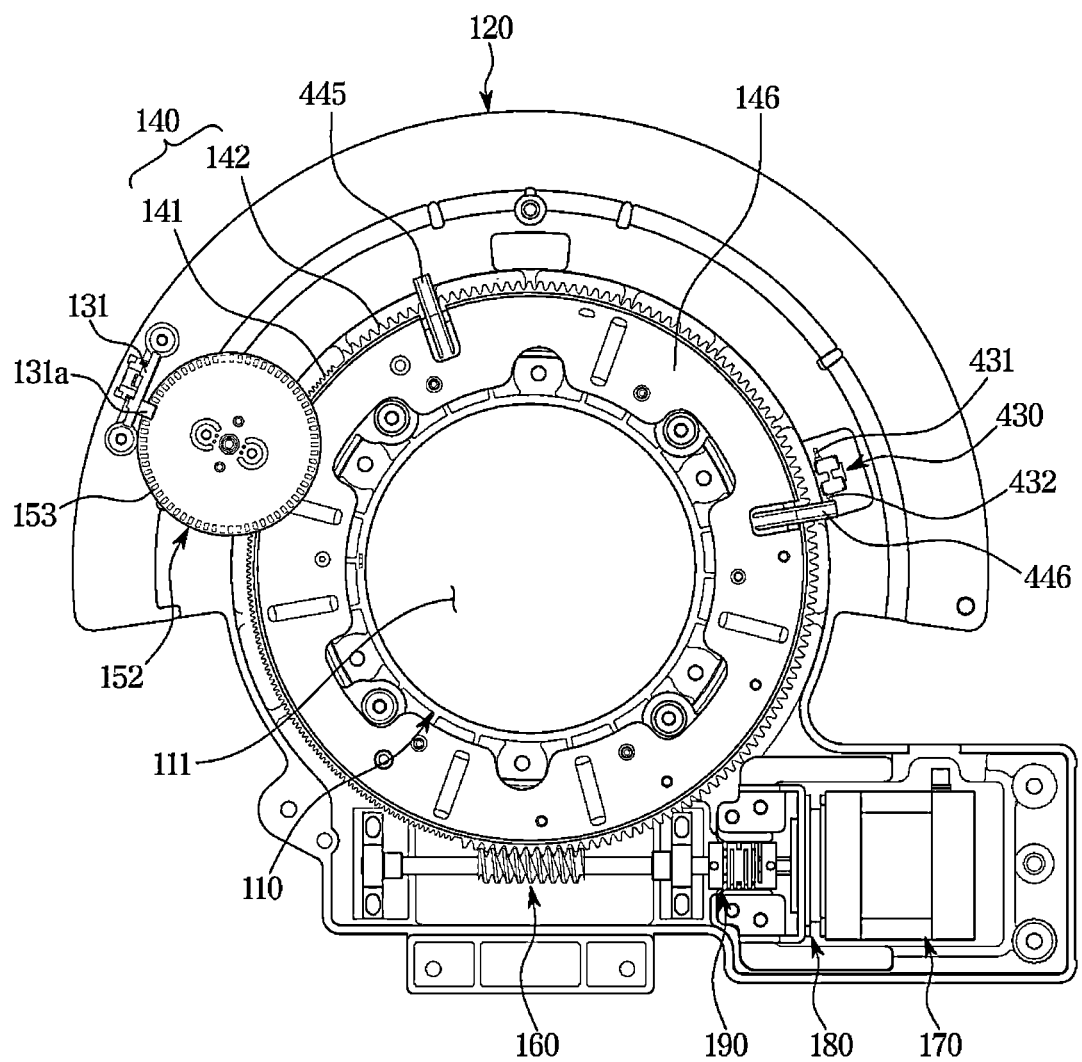
FIG. 22 is a view illustrating a rotating device when the display module is horizontally arranged in the display apparatus according to still another embodiment of the disclosure.

FIG. 21 is a view illustrating a rotating device when a display module is vertically arranged in a display apparatus according to still another embodiment of the disclosure. FIG. 22 is a view illustrating a rotating device when the display module is horizontally arranged in the display apparatus according to still another embodiment of the disclosure.

Referring to FIGS. 21 and 22, as for a display apparatus according to still embodiment, a rotating device may include a single switch 430 and two push protrusions 445 and 446.

The switch 430 may include a third button 431 and a fourth button 432. The push protrusion may include a first push protrusion 445 and a second push protrusion 446.

The third button 431 may be pushed by the first push protrusion 445 when the display apparatus is arranged in the vertical mode. The fourth button 432 may be pushed by the second push protrusion 446 when the display apparatus is arranged in the horizontal mode.

When the third button 431 of the fourth button 432 is pushed, the switch 430 may transmit a push input signal to a controller (not shown). The controller (not shown) may control the drive motor 170 to stop the operation of the drive motor 170 when receiving the push input signal.

Referring to FIG. 21, when the display apparatus is arranged in the vertical mode, the first push protrusion 445 may push the third button 431. As the third button 431 is pushed, the controller may stop the operation of the drive motor 170, and the display module 10 may be maintained in the vertical mode.

Referring to FIG. 22, when the display apparatus is arranged in the horizontal mode, the second push protrusion 446 may push the fourth button 432. As the fourth button 432 is pushed, the controller may stop the operation of the drive motor 170, and the display module 10 may be maintained in the horizontal mode.

Figure 23:
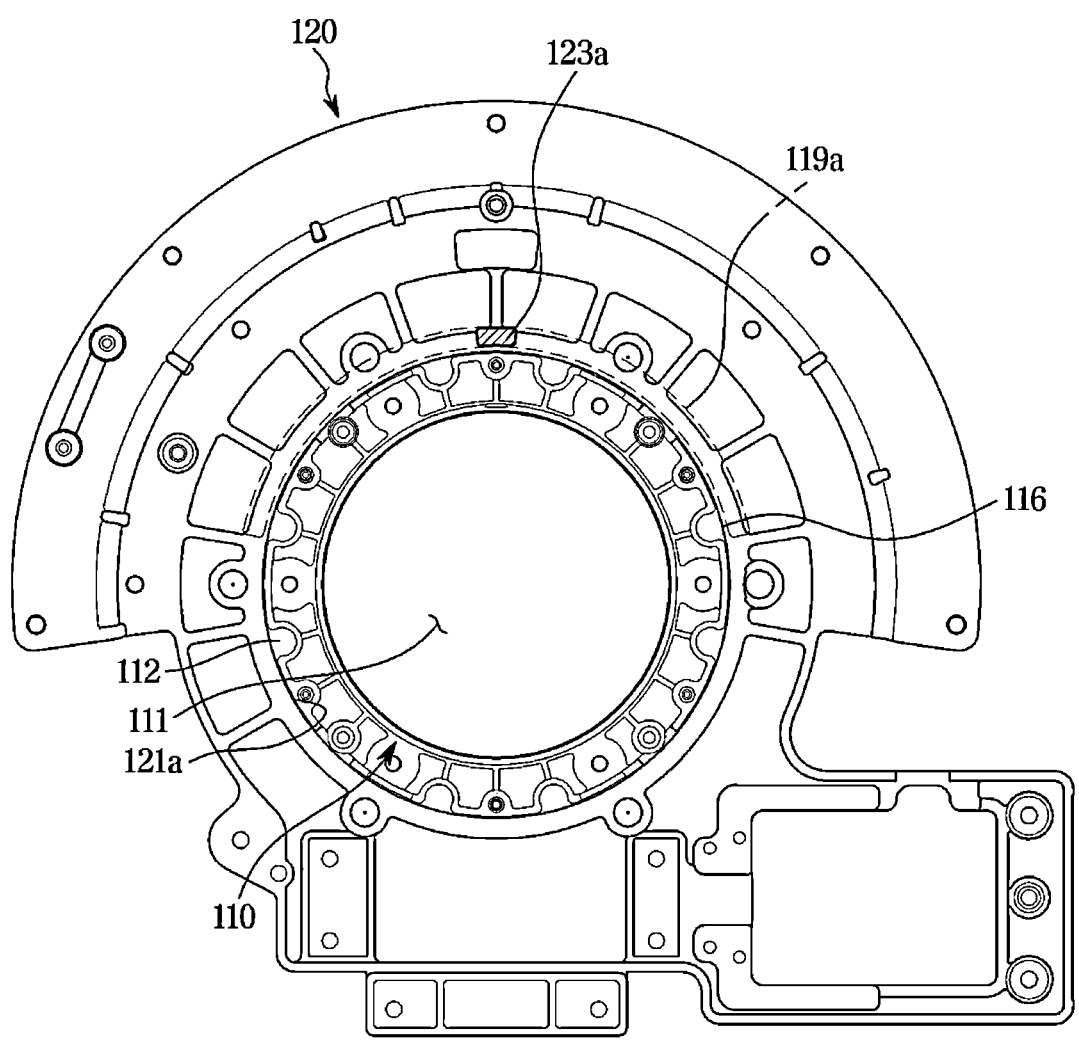
FIG. 23 is a view illustrating a fixed holder and a rotary holder when the display module is vertically arranged in the display apparatus according to still another embodiment of the disclosure.
Figure 24:
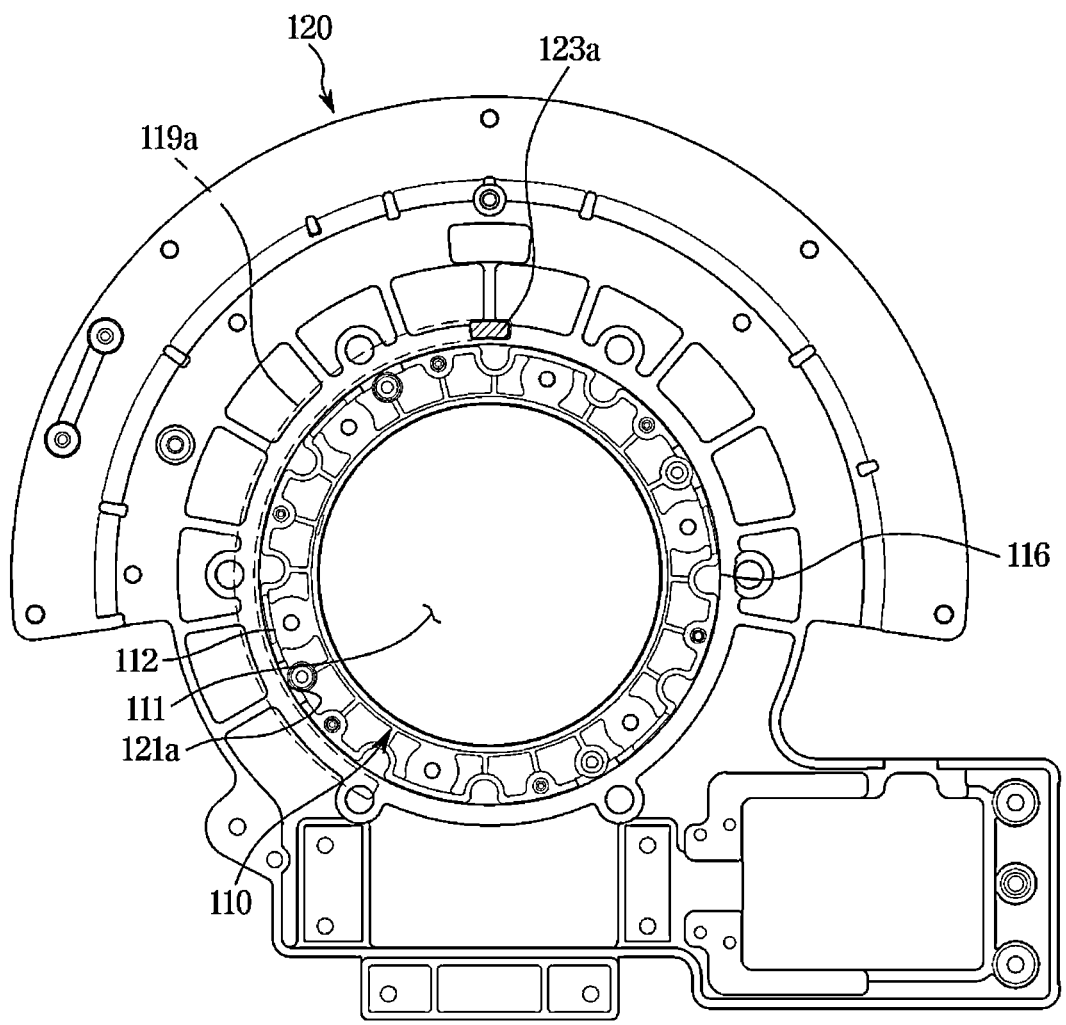
FIG. 24 is a view illustrating the fixed holder and the rotary holder when the display module illustrated in FIG. 23 is horizontally arranged by rotating in a first direction.
Figure 25:
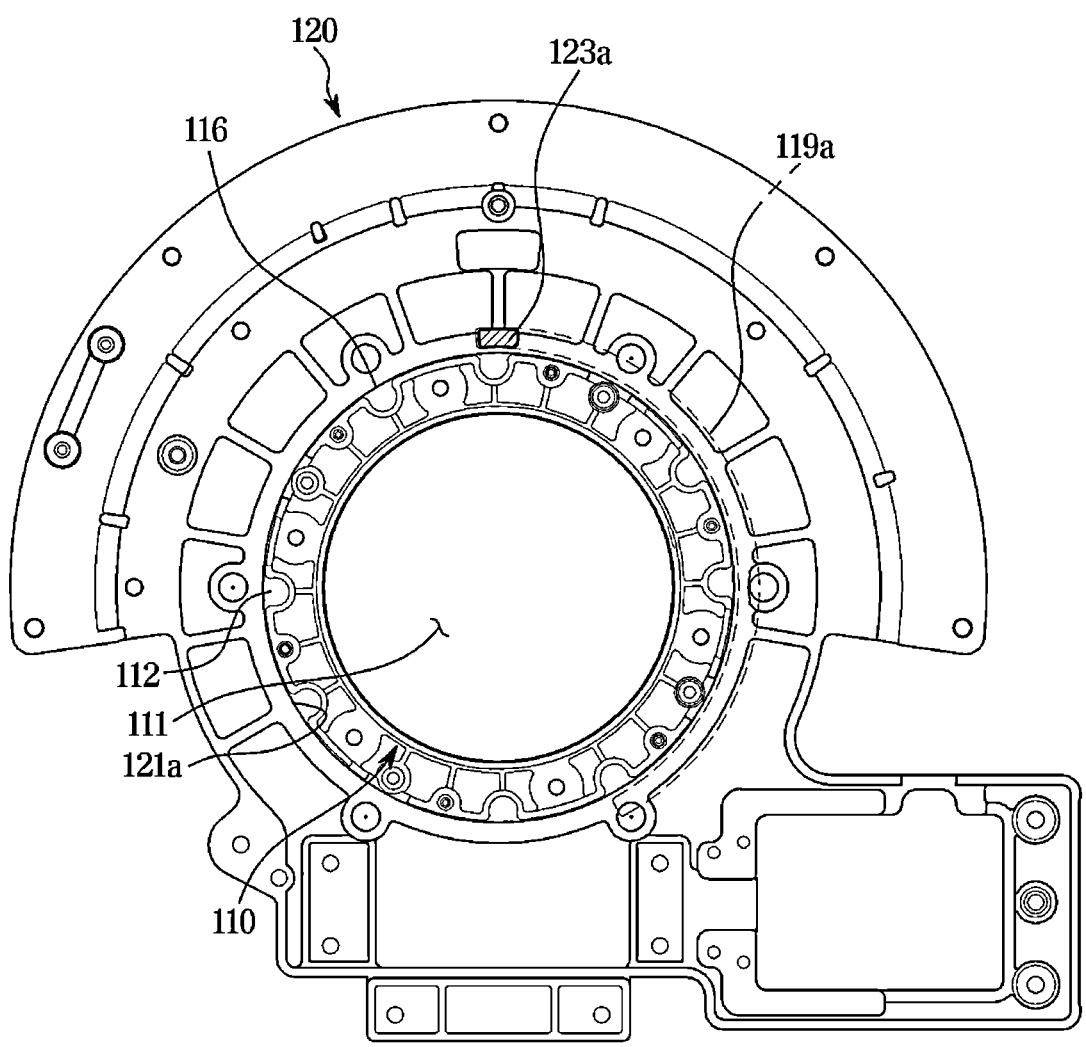
FIG. 25 is a view illustrating the fixed holder and the rotary holder when the display module illustrated in FIG. 23 is horizontally arranged by rotating in a second direction.

FIG. 23 is a view illustrating a fixed holder and a rotary holder when a display module is vertically arranged in the display apparatus according to still another embodiment of the disclosure. FIG. 24 is a view illustrating the fixed holder and the rotary holder when the display module illustrated in FIG. 23 is horizontally arranged by rotating in a first direction. FIG. 25 is a view illustrating the fixed holder and the rotary holder when the display module illustrated in FIG. 23 is horizontally arranged by rotating in a second direction.

Still another embodiment of the disclosure will be described with reference to FIGS. 23 to 25. According to still embodiment, a display module 10 in the vertical mode may rotate in both directions and then arranged in the horizontal mode.

A protrusion groove 119*a* may be provided in a substantially semicircular shape. The protrusion groove 119*a* may limit a movement range of a limiting protrusion 123*a* to about 180 degrees. As illustrated in FIG. 23, when the display module 10 is vertically arranged, the limiting protrusion 123*a* may be positioned at the center of the protrusion groove 119*a*. As illustrated in FIG. 24, when the display module 10 in the vertical mode rotates in a first direction, the rotary holder 110 may rotate in the first direction, together with the display module 10, and the limiting protrusion 123*a* may be placed at one end of the protrusion groove 119*a*. As the limiting protrusion 123*a* is in contact with one end of the protrusion groove 119*a*, the display module 10 may stop rotating and be maintained in the horizontal mode. In this state, when the display module 10 rotates in the second direction opposite to the first direction, the display module 10 may be vertically arranged. As illustrated in FIG. 25, the display module 10 in the vertical mode rotates in the second direction, the rotary holder 110 may rotate in the second direction, together with the display module 10, and the limiting protrusion 123*a* may be placed at the other end of the protrusion groove 119*a*. As the limiting protrusion 123*a* is in contact with the other of the protrusion groove 119*a*, the display module 10 may stop rotating and be maintained in the horizontal mode.

As mentioned above, according to still another embodiment, the display apparatus in the vertical mode may rotate in the first direction or the second direction and then the display apparatus may be horizontally arranged. In this case, the first direction and the second direction may indicate any one of a clockwise direction and a counterclockwise direction.

In addition, the display apparatus according to still another embodiment of the disclosure may not include a push protrusion and a switch, although not shown. A controller (not shown) may stop an operation of a drive motor 170 when the display module is rotated 90 degrees in the first or second direction in a state in which the display module is horizontally arranged because the limiting protrusion 123*a* is in contact with one end or the other end of the protrusion groove 119*a*. Accordingly, the display apparatus may arrange the display module horizontally or vertically, without the switch and the push protrusion.

Alternatively, the display apparatus may include a push protrusion and a switch, but may change a structure thereof. According to the modified structure, the push protrusion and the first switch may be configured to detect a state in which the display module in the vertical mode rotates in the first direction and then horizontally arranged. Further, the second switch may be configured to detect a state in which the display module in the vertical mode rotates in the second direction and then horizontally arranged. When the display module is horizontally arranged, the push protrusion may push the button of the first switch or the second switch. The controller (not shown) may stop an operation of the drive motor 170 when the display module 10 in the horizontal mode is rotated 90 degrees in the first or second direction. Accordingly, the display module 10 may be vertically arranged without a separate switch for detecting the vertical mode. The limiting protrusion 123*a* and the protrusion groove 119*a* may limit the rotation range of the display module 10 when the first or second switch does not operate normally.

Figure 26:
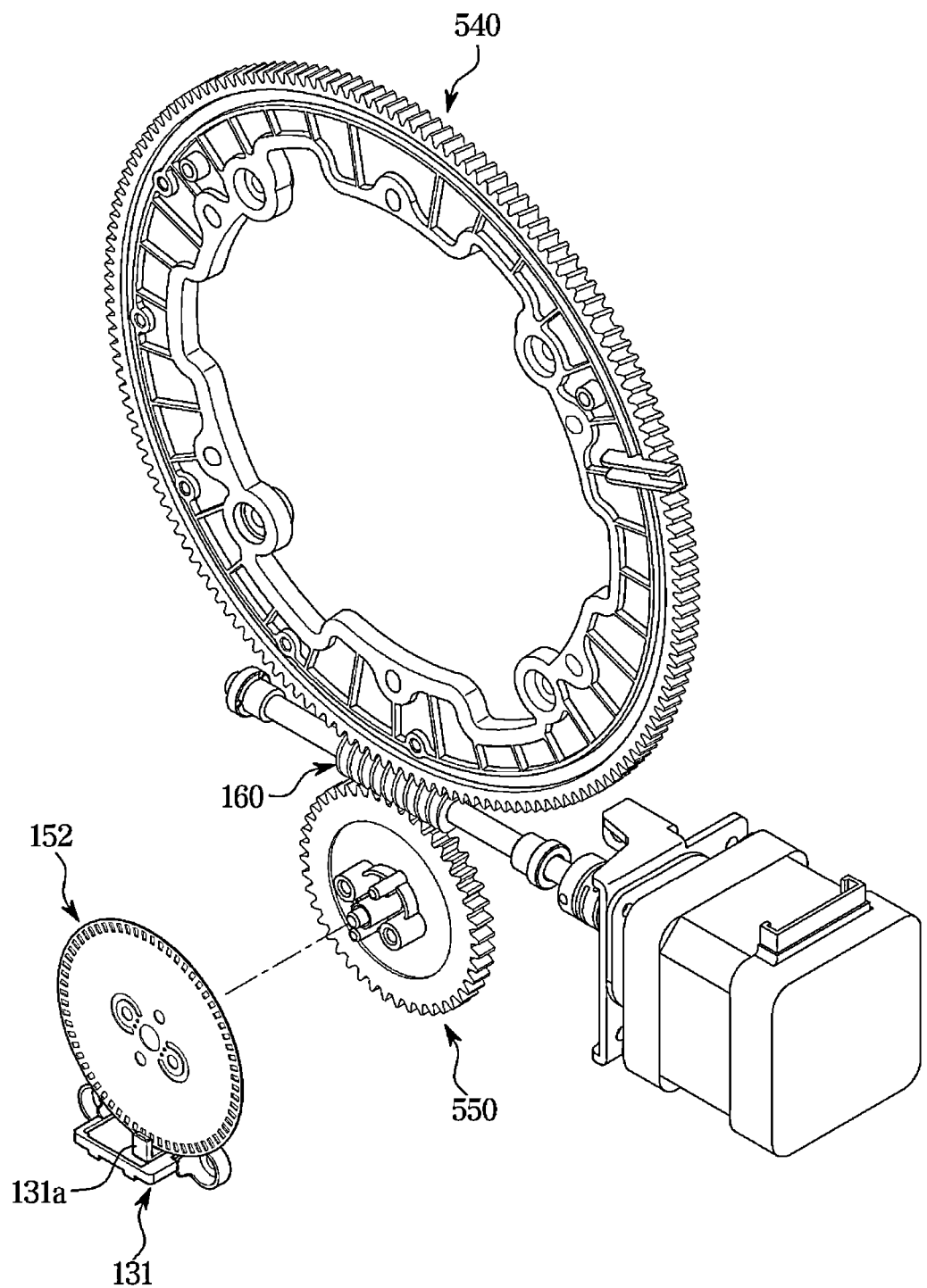
FIG. 26 is a view illustrating some components including gears in a display apparatus according to still another embodiment of the disclosure.

FIG. 26 is a view illustrating some components including gears in a display apparatus according to still another embodiment of the disclosure.

According to still another embodiment of the disclosure, a position of a detection sensor in the display apparatus may be changed, and the structure of the gear may be changed.

Referring to FIG. 26, a display apparatus according to still another embodiment of the disclosure may include a seventh gear 540 and an eighth gear 550 having a structure different from the above-described first gear 140 and second gear 150. Other configurations are the same as the above description, and thus redundant descriptions will be omitted.

According to another embodiment, the seventh gear 540 may be provided to have the same tooth shape. The seventh gear 540 may be provided as a helical gear. The eighth gear 550 may be configured to rotate in engagement with the third gear 160. The eighth gear 550 may be provided as a helical gear like the seventh gear 540. Therefore, when the third gear 160 rotates by receiving a driving force from a drive motor 170, the seventh gear 540 and the eighth gear 550 in engagement with the third gear 160 may rotate, respectively.

A detection sensor 131 may detect a rotation amount of the eighth gear 550, and a method of detecting the rotation amount of the eighth gear 550 by the detection sensor 131 may be the same as the method of detecting the rotation amount of 150 by the detection sensor 131. Therefore, a detailed description thereof will be omitted.

As is apparent from the above description, a display apparatus may include a display module and a supporter capable of rotating and supporting the display module.

The display apparatus may arrange a display module horizontally or vertically.

The display apparatus may reduce vibration and noise generated when the display module rotates.

The display apparatus may have improved space utilization and aesthetics by reducing a thickness of the display module and the supporter.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:
1. A display apparatus comprising:
a display configured to display an image; and
a supporter configured to support the display and configured to rotate the display within a predetermined range in a first direction or a second direction,
wherein the supporter comprises:
a gear coupleable to the display to rotate together with the display while the gear is coupled to the display,
wherein the gear comprises:
a first gear portion including a first tooth shape along a part of a same circumference of the gear, and
a second gear portion including a second tooth shape along a remainder part of the same circumference of the gear, the first tooth shape and the second tooth shape being different,
wherein the first gear portion and the second gear portion are aligned along a rotation direction of the gear.
2. The display apparatus of claim 1, wherein the gear is a first gear and the supporter further comprises a second gear configured to rotate in engagement with the first gear portion, and
a third gear configured to rotate together with a drive shaft of a drive motor and rotate in engagement with the second gear portion.

3. The display apparatus of claim 2, wherein
a rotation axis of the first gear and a rotation axis of the second gear are arranged in parallel with each other and the rotation axis of the first gear and a rotation axis of the third gear perpendicular to each other.
4. The display apparatus of claim 2, wherein
the first gear portion comprises a spur gear, and the second gear portion comprises a helical gear.
5. The display apparatus of claim 2, wherein
the second gear comprises a spur gear and the third gear comprises a worm gear.
6. The display apparatus of claim 2, wherein
the supporter further comprises:
a gear shaft configured to rotate together with the third gear, and
a shaft connecting member configured to connect the gear shaft to the drive shaft to allow the drive shaft and the gear shaft to rotate together.
7. The display apparatus of claim 6, wherein
the shaft connecting member comprises a cylindrical body in which the gear shaft and the drive shaft are coupled to opposite ends thereof, respectively; and at least one bending groove formed to be recessed along a circumference of the cylindrical body,
the at least one bending groove is provided along an axial direction of the gear shaft or the drive shaft.
8. The display apparatus of claim 1, wherein the gear is a first gear and
the supporter further comprises a detection sensor configured to detect a rotation amount of a second gear.
9. The display apparatus of claim 1, further comprising:
a roller installed on a rear surface of the display or a front surface of the supporter facing the rear surface of the display,
wherein the roller is configured to maintain a distance in a front-rear direction between the display and the supporter by being in contact with the rear surface of the display or the front surface of the supporter.
10. The display apparatus of claim 1, further comprising:
a flexible printed circuit board configured to electrically connect the display to the supporter,
the flexible printed circuit board is installed such that a first end thereof is electrically connected to the display and a second end thereof is electrically connected to the supporter.
11. The display apparatus of claim 10, wherein
the flexible printed circuit board comprises a connector provided between the first end and the second end, and
the connector is cut into several branches along a direction in which the flexible printed circuit board extends.
12. The display apparatus of claim 10, wherein
the flexible printed circuit board electrically connects the display to the supporter by passing through a first opening provided at a rear surface of the display and a second opening provided at a front surface of the supporter and corresponding to the first opening.

* * * * *